United States Patent
Long

(10) Patent No.: US 11,681,644 B2
(45) Date of Patent: Jun. 20, 2023

(54) SLOT POWER CONTROL FOR PERIPHERAL CARDS

(71) Applicant: Liqid Inc., Broomfield, CO (US)

(72) Inventor: Christopher R. Long, Colorado Springs, CO (US)

(73) Assignee: Liqid Inc., Broomfield, CO (US)

( * ) Notice: Subject to any disclaimer, the term of this patent is extended or adjusted under 35 U.S.C. 154(b) by 0 days.

(21) Appl. No.: 17/524,273

(22) Filed: Nov. 11, 2021

(65) Prior Publication Data

US 2022/0283976 A1 Sep. 8, 2022

Related U.S. Application Data

(60) Provisional application No. 63/156,751, filed on Mar. 4, 2021, provisional application No. 63/156,749, filed
(Continued)

(51) Int. Cl.
*G06F 13/40* (2006.01)
*G06F 1/3215* (2019.01)
*G06F 1/3234* (2019.01)

(52) U.S. Cl.
CPC .......... *G06F 13/4022* (2013.01); *G06F 1/325* (2013.01); *G06F 1/3215* (2013.01); *G06F 13/4027* (2013.01); *G06F 13/4081* (2013.01)

(58) Field of Classification Search
CPC ........ G06F 1/3215; G06F 1/325; G06F 1/185; G06F 1/189; G06F 1/26; G06F 1/1492; G06F 13/4022; G06F 13/4027
See application file for complete search history.

(56) References Cited

U.S. PATENT DOCUMENTS

| 7,567,434 B1 * | 7/2009 | Sivertsen | G06F 1/18 361/679.41 |
| 9,223,737 B1 | 12/2015 | Serebrin | |

(Continued)

OTHER PUBLICATIONS

International Search Report and Written Opinion for PCT Application No. PCT/US2022/017265, dated Jun. 21, 2022; 12 pages.
(Continued)

*Primary Examiner* — Raymond N Phan

(57) ABSTRACT

Designs for enabling safe insertion and removal of computing components from a live motherboard are presented herein. In one example, a method includes maintaining a slot power connection and an auxiliary power connection for a peripheral card slot in a powered-off state, and sensing insertion of a peripheral card into the peripheral card slot and responsively detecting whether the auxiliary power connection is employed by the peripheral card. Based on detecting the auxiliary power connection is employed by the peripheral card, the method further includes applying current limits selected for the peripheral card to the slot power connection and the auxiliary power connection and concurrently enabling the slot power connection and the auxiliary power connection for the peripheral card. Based on detecting the auxiliary power connection is not employed by the peripheral card, the method further includes applying a current limit selected for the peripheral card to the slot power connection and enabling only the slot power connection for the peripheral card.

18 Claims, 12 Drawing Sheets

Related U.S. Application Data on Mar. 4, 2021, provisional application No. 63/156,750, filed on Mar. 4, 2021.

(56) References Cited

U.S. PATENT DOCUMENTS

| | | | |
|---|---|---|---|
| 9,678,910 | B2 | 6/2017 | Breakstone et al. |
| 9,870,333 | B1 | 1/2018 | Lam et al. |
| 10,180,924 | B2 | 1/2019 | Breakstone et al. |
| 10,209,758 | B2* | 2/2019 | Gu ............................. G06F 1/32 |
| 10,592,291 | B2 | 3/2020 | Breakstone et al. |
| 2007/0028126 | A1* | 2/2007 | Wu ........................ G06F 1/186 713/300 |
| 2008/0317025 | A1 | 12/2008 | Manula et al. |
| 2009/0164687 | A1* | 6/2009 | Zhu ......................... G06F 1/325 710/302 |
| 2009/0172236 | A1* | 7/2009 | Sun ........................... G06F 1/26 710/302 |
| 2011/0060924 | A1* | 3/2011 | Khodorkovsky ..... G06F 1/3203 713/300 |
| 2011/0252249 | A1* | 10/2011 | Wang ........................ G06F 1/26 713/300 |
| 2013/0031288 | A1 | 1/2013 | Richard |
| 2013/0293018 | A1* | 11/2013 | Wu ......................... G06F 1/305 307/66 |
| 2014/0365698 | A1 | 12/2014 | Richard et al. |
| 2015/0370665 | A1 | 12/2015 | Cannata et al. |
| 2016/0062433 | A1 | 3/2016 | York |
| 2016/0224497 | A1 | 8/2016 | Hartman et al. |
| 2017/0046293 | A1 | 2/2017 | Lasater |
| 2017/0172007 | A1 | 6/2017 | Itkin et al. |
| 2017/0235347 | A1 | 8/2017 | Heyd et al. |
| 2018/0074993 | A1 | 3/2018 | Buckland et al. |
| 2018/0113496 | A1* | 4/2018 | Heinrich ................... G06F 1/28 |
| 2019/0012288 | A1 | 1/2019 | Zhao et al. |
| 2020/0278733 | A1 | 9/2020 | Li et al. |
| 2021/0100127 | A1 | 4/2021 | Farrahi et al. |
| 2022/0317756 | A1* | 10/2022 | Tikhostoup ........... G06F 1/3212 |

OTHER PUBLICATIONS

"GigaIO AIC Resource Box—Disaggregated Compute Accelerator for Deep Learning and HPC"; https://gigaio.com/wp-content/uploads/2020/09/GIO_AIC_ResourceBox.V2.0.pdf; Sep. 15, 2020; 1 page.

"GigaIO Gen4 Accelerator Pooling Appliance—Fully Managed Disaggregated Compute Accelerator Appliance for AI/DL, HPC, Visualization and Data Science Applications"; https://gigaio.com/wp-content/uploads/2020/11/Hydra-V11.0.pdf; Nov. 16, 2020; 2 pages.

* cited by examiner

SLOT POWER CONTROL FOR PERIPHERAL CARDS

RELATED APPLICATIONS

This application hereby claims the benefit of and priority to U.S. Provisional Patent Application 63/156,750, titled "HIGH PERFORMANCE COMPUTING SYSTEM," filed Mar. 4, 2021; to U.S. Provisional Patent Application 63/156,751, titled "POWER CONTROL FOR PCIe SLOTS," filed Mar. 4, 2021; and to U.S. Provisional Patent Application 63/156,749, titled "GPU SWITCH CHASSIS," filed Mar. 4, 2021, the contents of which are hereby incorporated by reference in their entirety.

BACKGROUND

Clustered computing systems have become popular as demand for data storage, data processing, and communication handling has increased. Data centers typically include large rack-mounted and network-coupled data storage and data processing systems. Many times, data centers and associated computing equipment can be employed to execute jobs for multiple concurrent users or applications. The jobs include execution jobs which can utilize resources of a data center to process data using central processing units (CPUs) or graphics processing units (GPUs). For example, GPU-based processing has increased in popularity for use in artificial intelligence (AI) and machine learning regimes. In these regimes, computing systems, such as blade servers, can include one or more GPUs along with associated CPUs for processing of large data sets.

Processing elements such as GPUs may be provided as cards which can be inserted into slots of a motherboard. Processing systems provided by data centers may have many cards slotted into a live system. Power may be provided to the cards via the slots directly, but the amount of power available to a card through the slot may be limited (e.g., 75 W). Cards that may consume large amounts of power, such as some Peripheral Component Interconnect Express (PCIe) GPU cards may require an auxiliary connector to provide additional power beyond the 75 W provided by the PCIe connector (e.g., in a ×16 slot), such as an additional +350 watts. The auxiliary connector may be a cable or power supply that plugs into a card separately from the PCIe slot.

Overview

Designs for enabling safe insertion and removal of computing components from a live motherboard are presented herein. In one example, a method includes maintaining a slot power connection and an auxiliary power connection for a peripheral card slot in a powered-off state, and sensing insertion of a peripheral card into the peripheral card slot and responsively detecting whether the auxiliary power connection is employed by the peripheral card. Based on detecting the auxiliary power connection is employed by the peripheral card, the method further includes applying current limits selected for the peripheral card to the slot power connection and the auxiliary power connection and concurrently enabling the slot power connection and the auxiliary power connection for the peripheral card. Based on detecting the auxiliary power connection is not employed by the peripheral card, the method further includes applying a current limit selected for the peripheral card to the slot power connection and enabling only the slot power connection for the peripheral card.

In another example, an apparatus includes a peripheral card slot to receive a peripheral card, and a power control circuit. The power control circuit is configured to maintain a slot power connection and an auxiliary power connection for the peripheral card slot in a powered-off state, and sense insertion of the peripheral card into the peripheral card slot and responsively detect whether the auxiliary power connection is employed by the peripheral card. Based on detecting the auxiliary power connection is employed by the peripheral card, the power control circuit is configured to apply current limits selected for the peripheral card to the slot power connection and the auxiliary power connection and concurrently enable the slot power connection and the auxiliary power connection for the peripheral card. Based on detecting the auxiliary power connection is not employed by the peripheral card, the power control circuit is configured to apply a current limit selected for the peripheral card to the slot power connection and enable only the slot power connection for the peripheral card.

In another example, an apparatus may comprise a rack-mount chassis including a plurality of peripheral card slots, including a first peripheral card slot, a plurality of auxiliary power connectors corresponding to the plurality of peripheral card slots, the plurality of auxiliary power connectors including a first auxiliary power connector, and a power control circuit. The power control circuit is configured to manage power to the plurality of peripheral card slots and the plurality of auxiliary power connectors, including maintain the plurality of peripheral card slots and the plurality of auxiliary power connectors in a power on state, while maintaining the first peripheral card slot and the first auxiliary power connector in a powered off state. The power control circuit is further configured to sense a connection of a peripheral card at both the first peripheral card slot and the first auxiliary power connector, and convert the first peripheral card slot and the first auxiliary power connector to the power on state only when the connection is detected concurrently at both the first peripheral card slot and the first auxiliary power connector.

This Overview is provided to introduce a selection of concepts in a simplified form that are further described below in the Technical Disclosure. It should be understood that this Overview is not intended to identify key features or essential features of the claimed subject matter, nor should it be used to limit the scope of the claimed subject matter.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
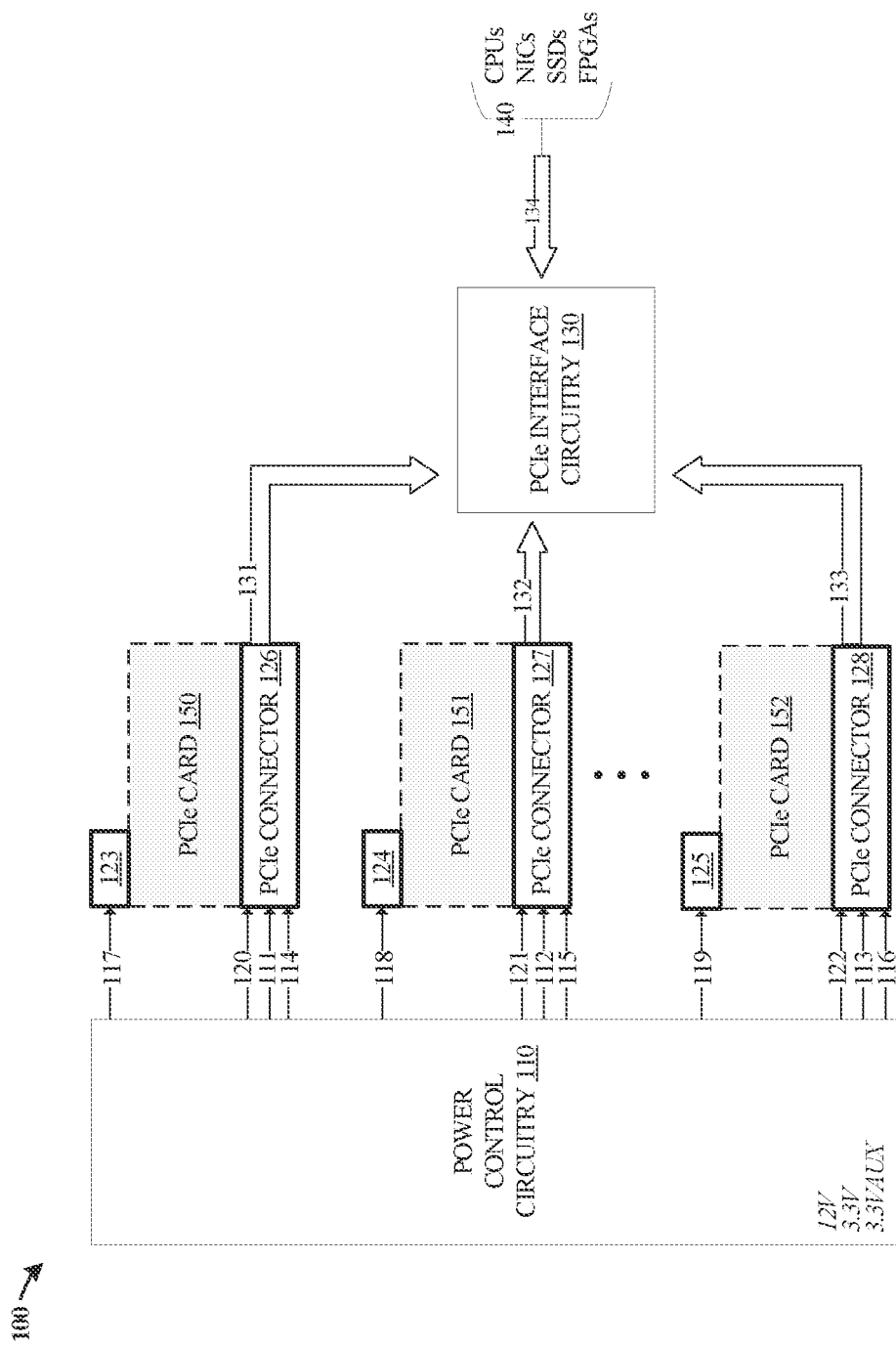
FIG. 1 is a diagram illustrating a power control system in an implementation.

Data processing for large data sets, such as via server computing systems in data centers, has become common. In these regimes, computing systems can include one or more GPUs along with associated CPUs for processing of large data sets. Processing elements such as GPUs may be provided as cards which can be inserted into slots of a motherboard. Processing systems provided by data centers may have many cards slotted into a live system. Some cards may employ power received through a peripheral card slot as well as supplemental power, such as from an auxiliary power cable.

If one of the power connections is provided to a card before the other (e.g., the auxiliary cable before the slot, or vice-versa) when inserting a card into a live system, the card may be damaged. Similarly, removing one of the power sources from a card before the other when removing the card from a live system may cause damage to the card. Damage to a card may include burning out overloaded power circuitry, power finding sneak paths through integrated circuit (IC) power structures, short circuits inadvertently encountered by physical removal, or similar problems. Damage may be permanent damage, or temporary problems until a full power cycle of the card is performed, or until the card is reset. Furthermore, connecting or removing cards with multiple power connections in a live system can cause false indications to the computing system that a card has been inserted or removed when the card is not fully connected or disconnected, leading to errors. Systems and methods are not available for hot plugging power intensive cards without powering down an entire system.

If the system into which a card is being inserted or removed is powered down, then there may be no risk in damaging the card when connecting or removing the power connections. However, powering down an entire system (e.g., a motherboard and all connected cards) to add or remove a card may create unwanted processing interruptions and delays.

The examples herein provide for enhanced systems for safely providing and removing power for computing components having multiple power connections, such as GPUs, in a live, powered-on processing system. The example designs provide a means to guarantee power will only be presented and removed from a component when adequate time or information has been retrieved or passed. Additionally, the example designs allow in-circuit power on/off control to help in troubleshooting and triage processes of recovering from code issues with the host (node) the circuit is attached too. Example systems also provide the ability to reduce wasteful energy expenditure when a component is not in use, and can be turned off (e.g., power may be removed). Example electronic fuse (eFuse or e-fuse) switches enable dynamic power limit controls, enabling the eFuse to control the range of acceptable power provided to a component based on the specific requirements of the component.

These examples can be employed in a rackmount-capable chassis having a circuit, mainboard, or motherboard with a plurality of slots (which may use PCIe or other communication protocols) into which high power draw add-in cards can be inserted, such as GPUs, tensor processing units (TPUs), or other processing cards. Slots of the chassis can be powered down individually and reset, for example to attempt to recover or troubleshoot failed slots or cards without removal. Moreover, individual slots can have associated cards removed or inserted without powering down the entire chassis or mainboard that houses other slots or cards.

As an example, a three-stage debug/reset process can be performed for non-responsive or defective cards in slots. The process may include, (1) perform a PCIe-initiated reset (e.g., a soft reset) comprising an in-band reset; (2) perform an out-of-band (e.g., a hard reset); and (3) perform a power cycle of the slot itself, independent of the other slots in the chassis, to restart the affected card.

Example designs can have an eFuse circuit per voltage rail for each slot/card. Current limits for certain eFuse circuits can be dynamically adjusted according to properties of the card inserted. For example, during insertion of a card, a 3.3V auxiliary power rail connected to the slot can be initially enabled (and having a fixed-current eFuse set to, e.g., ~350 mA). The 3.3V auxiliary power may allow retrieval of vital product data (VPD) for a card from an EEPROM (electrically erasable programmable read-only memory), where the VPD information indicates a card power requirement or current level needed. This indication may be a model number or other card identifier, which may then be cross-checked against a data structure (e.g., a table stored to a memory of the processing system) that indicates empirical power requirement data, or may directly indicate a power or current requirement in watts or amps. From this data, the eFuses for other voltage rails (e.g., 12V PCIe Auxiliary connector and 3.3V PCIe slot) can be adjusted to provide adequate current for the present card. This dynamic current limit adjustment process can occur before and independently of any PCIe bus-accessed status and configuration operations for the card.

As a first example system, FIG. 1 is presented. FIG. 1 is a system diagram illustrating computing system 100. System 100 may include power control circuitry 110, one or more PCIe connector slots 126, 127, and 128, one or more PCIe auxiliary power connectors 123, 124, and 125, and PCIe interface circuitry 130. Multiple components of system 100 may be included in a single physical device, such as on a circuit board of a rackmount chassis casing, or one or more components may be remotely located and connected via communication interfaces and power lines.

The PCIe interface connectors 126-128 may be peripheral card slots configured to receive and interface with a PCIe card, such as PCIe cards 150, 151, and 152. PCIe slots 126-128 may come in different physical configurations, such as edge connectors, ×1, ×4, ×8, ×16, and ×32, where the number after the x may indicate how many lanes or pins that PCIe slot has. Slot widths can be selected to support single-wide or double-wide PCIe cards, among other widths, including combinations thereof. While some cards can be wider (e.g., double-wide) with respect to a slot, they may still only couple into a single slot and its associated slot power. The PCIe connectors 126-128 may be configured to provide power to a slotted PCIe card 150-152 through one or more power rails, such as a primary 12V power rail 120, 121, and 122, a primary 3.3V power rail 111, 112, and 113, and an auxiliary 3.3V power rail (3.3V AUX) 114, 115, and 116. The PCIe connector 126-128 may also be configured to provide data to and receive data from PCIe card 150-152, for example to provide data to the card 150-152 for processing and to receive processed data results. Data may be communicated to and from the PCI connector 126-128 via data channels or busses 131, 132, and 133, which may communicate with PCIe interface circuitry 130.

PCIe interface circuitry 130 may include communication and control circuitry for managing communication among and between components of system 100, as well as communication with components 140 that may be a part of or external to system 100 over data channel or bus 134. Components 140 may include elements such as central processing units (CPUs), network interface cards (NICs), solid state drives (SSDs), field-programmable gate arrays (FPGAs), other computing components, or any combination thereof. In an example, PCIe interface circuitry 130 may include one or more components of a communication fabric formed from among a plurality of PCIe switching elements and various control elements. Among these control elements may be a control system or circuit which controls PCIe switch circuitry, provides control access to external agents to the control system and PCIe switch circuitry, and also provides various fabric management functions to compose/decompose logical arrangements of components (e.g., among PCIe cards 150-152 and additional components 140) within the PCIe fabric. In some examples, the PCIe interface circuitry 130 may employ Ethernet traffic transported over a PCIe link or other link.

In addition to communication links and buses, PCIe interface circuitry 130 can comprise one or more microprocessors and other processing circuitry that retrieves and executes software, such as job interfaces and fabric management software, from an associated storage system (not shown). PCIe interface circuitry 130 can be implemented within a single processing device but can also be distributed across multiple processing devices or sub-systems that cooperate in executing program instructions. Examples of PCIe interface circuitry 130 may include general purpose central processing units, application specific processors, and logic devices, as well as any other type of processing device, combinations, or variations thereof. In some examples, PCIe interface circuitry 130 comprises an Intel® microprocessor, Apple® microprocessor, AMD® microprocessor, ARM® microprocessor, field-programmable gate array (FPGA), application specific integrated circuit (ASIC), application specific processor, or other microprocessor or processing elements.

Peripheral PCIe cards 150-152 may receive power to operate via the PCIe connector slots 126-128. The PCIe connector slots 126-128 may provide power to the PCIe cards 150-152 via one or more power inputs, such as a 12V power line or rail 120-122, a 3.3V power via power line or rail 111-113, and a 3.3V auxiliary power line or rail 114-116. The power rails can be used in any combination to provide power to the PCIe cards 150-152. However, some PCIe cards 150-152 may require more power to operate than can be provided via the PCIe connector 126-128. The cards 150-152 may be configured with an additional power connection interface that can connect to a PCIe auxiliary power connector 123-125. The auxiliary power connector 123-125 may be configured to provide additional current (e.g. 50A @ 12V) over a power line or power rail 117, 118, and 119.

Power control circuitry 110 may include one or more circuits or processors configured to manage the provision of power to PCIe cards 150-152 over the various power rails or lines 111-122. Power control circuitry 110 may monitor telemetry readings for metrics such as power usage (e.g., voltage and current), temperature, or other data. Power control circuitry 110 may control current limits provided over the power lines 111-122 to prevent catastrophic system failure, and may control power on/off settings to various power lines based on a status of any connected PCIe cards 150-152. Power control circuitry 110 may include one or more eFuse circuits to control power over particular power rails, as well as additional processors or logic circuits to manage power on/off control, status monitoring, firmware execution, or other operations.

A card 150-152 that receives power over both the PCIe connector 126-128 and PCIe auxiliary power 123-125 may be damaged if a live power connection is provided through one of the connectors 126-128, 123-125 when the other connector is not connected. This could arise when inserting or removing card 150-152 from a live or powered board (e.g., a motherboard or mainboard including connectors 126-128), as it may be difficult or impossible to connect or remove both power connections simultaneously. While risk of damage can be eliminated by shutting off the power to the whole board, this may interrupt processing being performed by other components of a system. For example, if PCIe card 151 needs to be replaced or diagnosed, the entire system 100 may be shut down including the connectors for PCIe cards 150 and 152, which may have been occupied performing other tasks. It would therefore be advantageous if PCIe peripheral cards with high power requirements could be inserted into or removed from a live board (e.g., hot swapping or live swapping, or similar terminology).

Accordingly, power control circuitry 110 may be configured to control the provision of power over the power rails 111-122 to enable cards 150-152 to be connected or disconnected safely, without shutting off power to other cards 150-152. The power control circuitry 110 may implement systems and methods as described herein to detect the connection or disconnection of power lines 111-122 to turn power rails off and on in a manner that allows safe hot swapping of PCIe cards 150-152 into a live board. For example, using firmware, hardware, or a combination of both, the power control circuitry 110 may detect when a card is connected or disconnected from a PCIe connector slot 126-128 or a PCIe auxiliary power line 123-125, and turn a power supply to the associated slot and auxiliary line on or off accordingly. For example, if power control circuitry 110 detects that PCIe auxiliary connector 123 has been disconnected from PCIe card 150, or if the PCIe card 150 has been disconnected from the PCIe connector 126, the power control circuitry 110 may shut off power to both the auxiliary power line 117 and primary card slot power lines 111 and 120 (and in some examples, auxiliary card slot line 114) to prevent damage to the card. If a card 150 is not plugged into system 100, or if a determination is made that the card 150 is idle or otherwise inactive, the power control circuitry 110 can shut off power to the corresponding connector slot 126 and auxiliary power connector 123 to conserve energy. If a card 150 is detected as being connected to one of PCIe connector 126 or auxiliary connector 123, the power control circuitry 110 may keep power off until a determination is made that both the PCIe connector 126 and the auxiliary connector 123 are connected.

In some examples, an auxiliary power line of the PCIe connector (e.g., 3.3V Aux lines 114-116) may be active without damaging card 150-152, even if the 12V auxiliary power line 117-119 is not connected. The power from the 3.3V auxiliary line 114-116 may be used to determine the power requirements of a connected card 150-152, such as by reading an EEPROM memory of the card 150-152. As described previously, the data read from the card 150-152 may include a model number or other card identifier, which identifier may be provided to power control circuitry 110 or another processing element (e.g., PCIe interface circuitry 130, or CPU 140). The processing element may compare the identifier against a data structure (e.g., stored to a memory of the processing system) that indicates empirical power requirement data, or may directly indicate the card's power or current requirement in watts or amps. From this data, the power control circuitry 110 may adjust power thresholds for other voltage rails (e.g., 12V PCIe Auxiliary connector 123-125 and 12V and 3.3V PCIe slot 126-128 lines via main power rails 120-122 and 111-113) to provide adequate current for the present card 150-152. This dynamic current limit adjustment process can occur before and independently of any PCIe bus-accessed status and configuration operations for the card 150-152. The EEPROM information may be retrieved via an associated bus, such as I²C (Inter-Integrated Circuit), SMBus (System Management Bus), or PMBus (Power Management Bus), which may include buses 131-134, or another bus (not shown).

Figure 2:
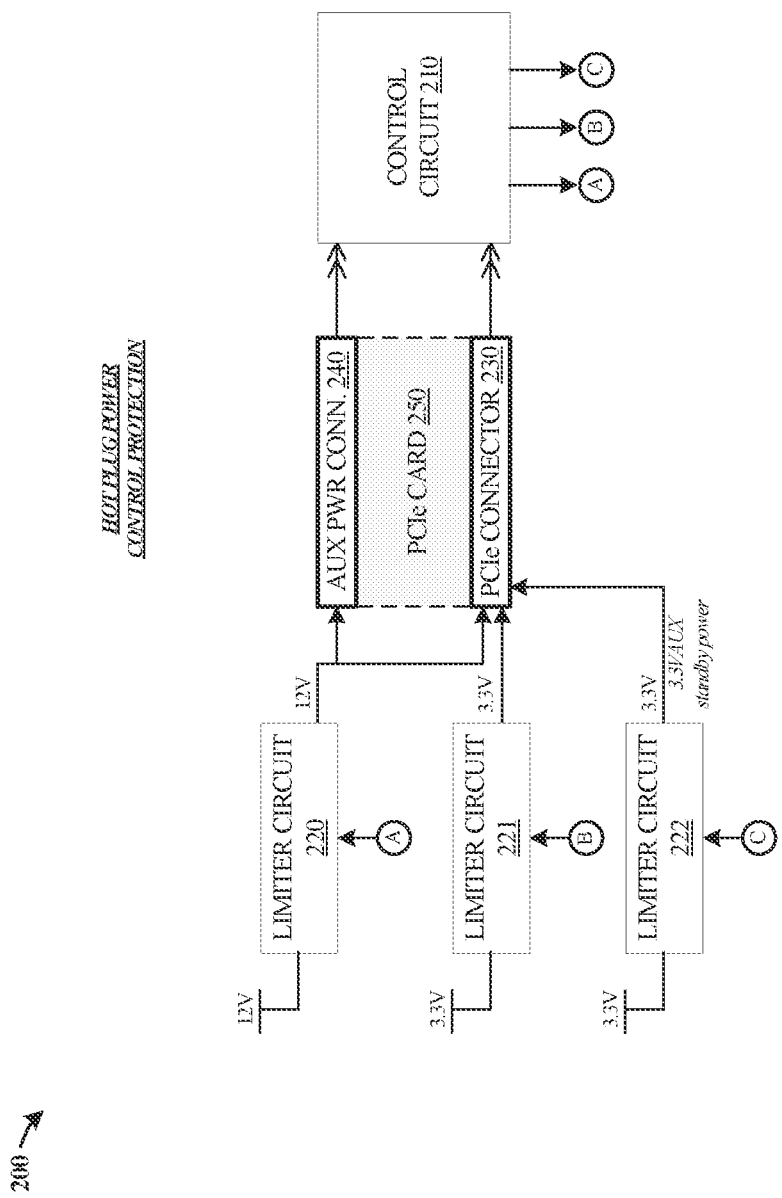
FIG. 2 is a diagram illustrating a hot plug power control system in an implementation.

Turning now to FIG. 2, additional detail is provided for an example computing system 200. System 200 may include a control circuit 210, a limiter circuit 220 for a 12 Volt power line, a limiter circuit 221 for a primary 3.3 Volt power line, and a limiter circuit 222 for an auxiliary 3.3 Volt power line. System 200 may further include a PCIe connecter slot 230, and an auxiliary power connecter 240, both of which may be configured to connect to a PCIe card 250.

In some examples, PCIe connector 230 may correspond to PCIe connectors 126-128 of FIG. 1, and auxiliary power connector 240 may correspond to PCIe auxiliary power connectors 123-125 of FIG. 1. Similarly, power control circuit 210 may correspond to power control circuitry 110 of FIG. 1. Limiter circuits 220-222 may include eFuses or other circuits configured to control a power range provided to a PCIe card 250. Limiter circuits 220-222 may be included in power control circuitry 110 of FIG. 1, or they may be situated between power control circuitry 110 and PCIe connector slots 126-128 and PCIe auxiliary power connectors 123-125.

Limiter circuits 220-222 may be configured to control an amount of power or current provided over various power rails to PCIe connector slot 230 and auxiliary power connector 240. For example, auxiliary power connector 240 may receive a 12V power line via limiter circuit 220, while PCIe connector 230 may be connected to power rails for a primary 3.3V line via limiter circuit 221, an auxiliary 3.3V power line via limiter circuit 222, or a 12V power line via limiter circuit 220. In the depicted example, there may be a single limiter circuit per voltage rail, so that the limiter circuit 220 may control the power 12V provided to the both the auxiliary power connector 240 and the PCIe connector 230. In another embodiment, there may be separate limiter circuits for per-destination instead of per-rail. While examples of the voltage provided over various power lines are provided herein, other voltage amounts may be used in other example embodiments. The limiter circuits 220-222 may have both a power input line as well as control signal inputs, designated A, B, and C, from the power control circuit 210. The control signal inputs A-C may allow control circuit 210 to adjust an amount of power or current provided via each limiter circuit 220-222, including raising or lowering a power supply, or turning a power line on or off entirely.

Control circuit 210 may receive signals or indicators from PCIe connector 230, auxiliary power connector 240, or both. In some examples, the signals may provide information on an inserted PCIe card 250, such as by using the 3.3V auxiliary (e.g., I²C) line to read data from a memory (e.g., an EEPROM) of the PCIe card 250 to determine a model or power requirements of the card. This model or power requirement information may be applied by the control circuit 210 to set power limits applied by limiter circuits 220-222 via control signals A-C. For example, the control circuit 210 may use the information from the card 250 to determine how much power or current to apply through a primary 3.3V slot connection via limiter circuit 221 at PCIe connector 230, how much power or current to apply through limiter circuit 220 to auxiliary power connector 240 or PCIe connector 230, or whether the card 250 needs the auxiliary power connector 240 at all.

Similarly, control circuit 210 may receive indicators regarding whether a card 250 is plugged into PCIe connector slot 230, or whether the auxiliary power connector 240 is connected to a card 250. For example, a control line PE_PRESENT #may connect a GPIO (general-purpose input/output) digital signal pin of the PCIe connect 230 to a microcontroller (such as control circuit 210, although in some examples an IO Expander or FPGA may be used). The PE_PRESENT #signal may indicate when a card is inserted into PCIe connector 230. Similarly, a control line AUX CABLE PRESENT #may connect a GPIO pin of the auxiliary power connector 240 (e.g., via an AUX_SENSE line as discussed in FIG. 3) to a microcontroller to indicate when the auxiliary power cable is connected. An example usage of these signal lines to control power is described in more detail in regard to FIGS. 3 and 4. The control circuit 210 may disable (or keep at the minimal amount) a power supply at limiter circuits 220 and 221 if only one of the two connections is detected, to avoid damage to the card 250 during hot plugging. If the appropriate power connections for operating the card 250 (e.g., only the PCIe connector 230, or both connections at PCIe connector slot 230 and auxiliary power connector 240) are determined to be secure and stable (e.g., based on a timeout period), the control circuit 210 can direct the limiter circuits 220-222 to apply an appropriate amount of power or current to turn on and operate PCIe card 250. An example circuit diagram for a power control system is described in regard to FIG. 3.

Figure 3:
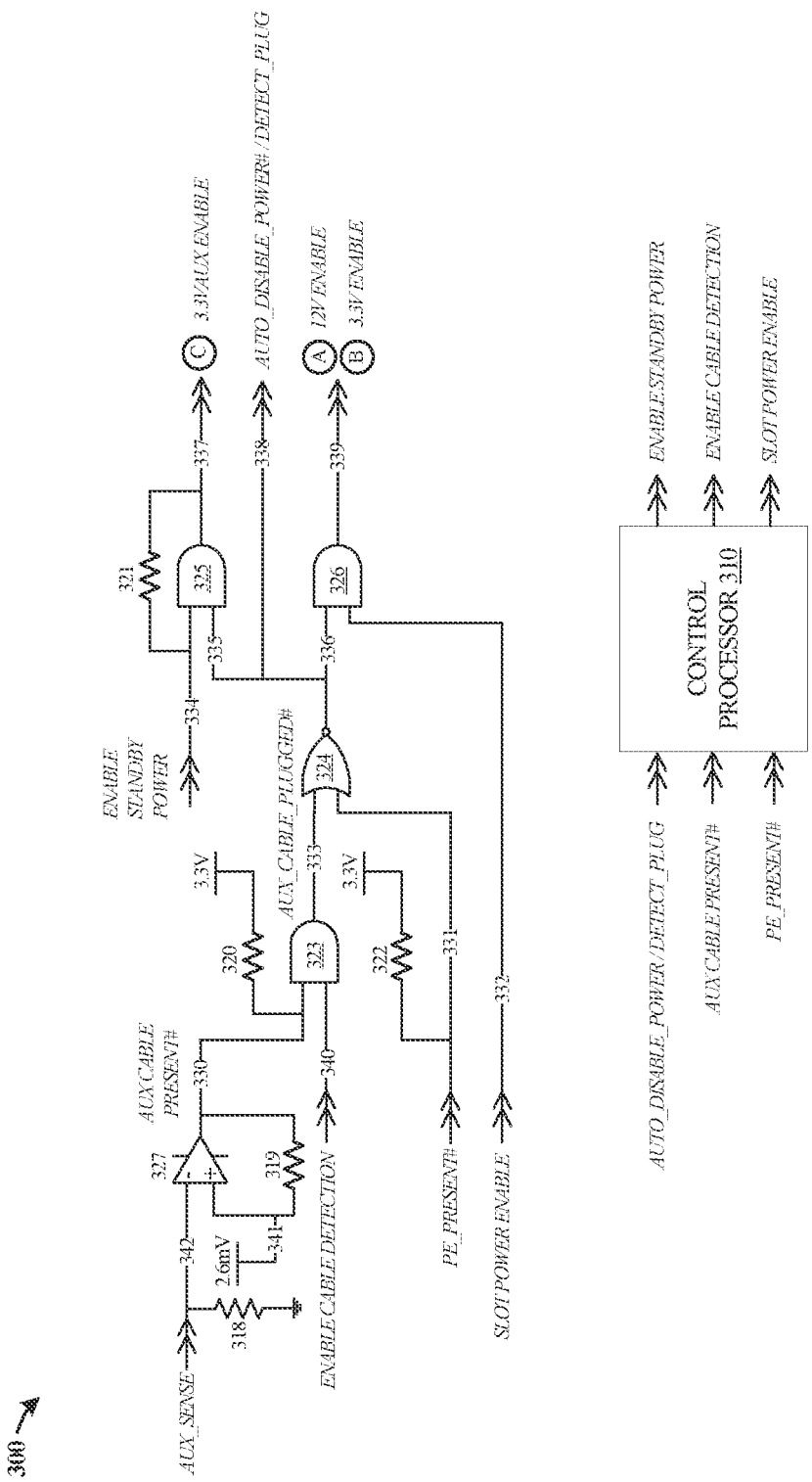
FIG. 3 is a diagram illustrating a power control circuit in an implementation.

FIG. 3 depicts an example circuit diagram 300 for implementing hot plug power control protection for PCIe peripheral cards. The circuit diagram 300 shows an example system for generating control signals A, B, and C, shown in FIG. 2, to disable or enable power on example auxiliary 12V, primary 12V, primary 3.3V, and 3.3V AUX lines. Circuit 300 may include a set of logic gates and signal lines, as well as control processor 310. Control processor 310 may be a microprocessor, FPGA, or similar circuit configured to detect a connection status of a PCIe card slot and auxiliary cable, and enable or disable slot power, cable detection, and standby power based on the determination. The circuit diagram 300 may be incorporated into control circuit 210 of FIG. 2.

The circuit 300 may receive signal AUX_SENSE, a sense line for connection of an auxiliary power cable, along line 342 (e.g., from auxiliary power connector 240 of FIG. 2). The AUX_SENSE line can serve a dual purpose. Under PCIe-SIG (special interest group) standard specification, connecting an auxiliary cable to a card can short the sense line on the auxiliary connector to indicate a type of power. In the example embodiment of FIG. 2, AUX_SENSE 342 can be used not just for shorted output, but also as an input. By pulling AUX_SENSE 342 down to ground via a low value resistor 318, line 342 can be used as an input for detection, since cards that use aux power may pull the AUX_SENSE line up. Line 342 may be provided to a comparator 327 (optionally implemented via an operational amplifier), which may be used with hysteresis to detect if the AUX_SENSE line is above 2.6 mV (e.g. by comparing AUX_SENSE with a feedback loop across resistor 319 and 2.6 mV line 341).

The output of comparator 327 may produce signal "AUX CABLE PRESENT #," alternately referred to as "CABLE_PRSNT #," along line 330. AUX CABLE PRESENT #330 may provide an indicator of whether an auxiliary cable is connected to a PCIe card based on the AUX_SENSE line 342 and the comparison performed at comparator 327 (with the # in a signal name indicating an active-low or inverted logic state for the signal). For example, AUX CABLE PRESENT #330 may be logic 0 when an auxiliary cable is connected, or 1 when no cable is connected. Similarly, circuit 300 may receive a signal "PE_PRESENT #" (e.g., from PCIe connector slot 230 of FIG. 2), alternately referred to as "PE_PRSNT #", along line 331 to provide an indicator of whether a PCIe card is plugged into the PCIe connector slot. PE_PRESENT #331 may also be used to determine card size (e.g., ×1, ×4, ×8, ×16). AUX CABLE PRESENT #330 and PE_PRESENT #331 may be provided to control processor 310 as well as to the hardware logic of circuit 300.

Further, circuit 300 may receive signals "ENABLE STANDBY POWER" on line 334, "ENABLE CABLE DETECTION" on line 340, and "SLOT POWER ENABLE" on line 332, each of which may be provided from control processor 310 based on a detected card and auxiliary cable status. ENABLE STANDBY POWER 334, alternately referred to as "SLOT_3V3_AUX_EN," may control whether to enable a 3.3V auxiliary power control line, for example via control signal C to limiter circuit 222 of FIG. 2. ENABLE CABLE DETECTION 340, alternately referred to as "En_CBL_DETECT," may control whether the circuit monitors for a connection status of the 12V auxiliary power connector 240 of FIG. 2. For example, if a determination is made that the card does not require an auxiliary power supply to supplement the slot power, cable detection can be skipped or deactivated. ENABLE CABLE DETECTION 340 can generally be used by control processor 310 to enforce gating to control power on and off timing. SLOT POWER ENABLE 332, alternately referred to as "SLOT_12V_3V3_EN," may control whether to provide power via 3.3V primary power line and via 12V power line (e.g., via control signal B to limiter circuit 221 and via control signal A to limiter circuit 220 of FIG. 2). SLOT POWER ENABLE 332 may be activated when the system detects a connection at both the slot 230 and auxiliary connector 240, or at only the slot 230 if a determination is made that no auxiliary cable is to be connected.

Standby power may be enabled for the PCIe slot 230 based on an ENABLE STANDBY POWER signal along line 334. A 3.3V AUX ENABLE signal "C" may be output along line 337 and provided to limiter circuit 222. For example, standby power may be activated when a card 250 is detected as being inserted into the PCIe connector slot 230. Enabling standby power may allow reading card details, e.g., from an EEPROM of the card, that may indicate an amount of power the card requires to operate. The standby power signal from line 334 may be sent across a resistor 321 to provide the 3.3V AUX ENABLE signal 337, or the signal 337 may be output from an AND gate 325 based on signal 334 and a signal 335 representing a status of a plugged card and connected auxiliary cable. The 321 pathway may be removed and the AND gate 325 may be used to enable full hardware power off control of the 3.3V auxiliary power. Alternately, the AND gate 315 (and signal line 335) may be removed and the 321 pathway may be used for full software-based control of the 3.3V auxiliary power (e.g. via control processor 310 based on the ENABLE STANDBY POWER signal).

Supplemental power (e.g. 3.3V) may be provided across element 322 to line 331, across element 320 to line 330, or both, to provide additional protection from plug transients, such as sporadic signals or voltage spikes when a card is not fully and securely connected during insertion or removal. Elements 322 and 320 may include a pull-up resistor that provides a consistent input to a logic gate when an 'external' input on that line may sometimes be floating or unconnected, for example. Additional circuitry can be included between lines 320 or 322 and GROUND in the form of a transient-voltage-suppression (TVS) diode that can clamp voltages above a certain level to protect from electrostatic discharge or other unwanted spikes on lines that might have user-influenced connections (e.g. slots, plugs, switches).

As indicated above, AUX CABLE PRESENT #330 may be applied to AND gate 323, with a 0 value when a card is connected to auxiliary power connector 240, and a 1 value when the auxiliary power connector is not connected to a card. Similarly, ENABLE CABLE DETECTION 340 may be applied to AND gate 323, with a 1 value when an auxiliary cable connection is needed to enable power, and a 0 value when an auxiliary cable connection is not required. Based on the inputs, the AND gate 323 may generate a signal AUX_CABLE_PLUGGED #333, which may be applied to NOR gate 324. Accordingly, AUX_CABLE_PLUGGED #333 may indicate whether power may be supplied to a card based on a status of the auxiliary cable connection, where a 0 value may indicate either that an auxiliary cable is connected, or that no auxiliary cable is required.

TABLE 1

AUX_CABLE_PLUGGED# 333 values based on AND gate 323 logic states
AND Gate 323 Truth Table

| AUX CABLE PRESENT# 330 | ENABLE CABLE DETECTION 340 | AUX CABLE PLUGGED# 333 |
|---|---|---|
| 1 (no cable) | 1 (need cable) | 1 (don't enable power) |
| 1 (no cable) | 0 (don't need cable) | 0 (enable power) |
| 0 (cable detected) | 1 (need cable) | 0 (enable power) |
| 0 (cable detected) | 0 (don't need cable) | 0 (enable power) |

Similarly, PE_PRESENT #signal 331 may be applied to NOR gate 324, with a 0 value when a card is connected to slot 230, and a 1 value when the no card is connected. When both the PE_PRESENT #signal 331 and the AUX_CABLE_PLUGGED #signal 333 are applied to NOR gate 324 with 0 values, it may indicate that a PCIe card 250 is fully connected at both the PCIe connector slot 230 and the auxiliary power connector 240, or that a card connected at slot 230 does not require an auxiliary cable. The NOR gate 324 may then generate a signal indicating the card is connected, which may be provided as an AUTO_DIASBLE_POWER #/DETECT_PLUG signal 338 applied to control processor 310. The signal from NOR gate 324 may also be provided as signal 335 to the AND gate 325, which may be used for hardware-based control for activating or disactivating the "standby power" with 3.3V AUX ENABLE signal 337.

TABLE 2

AUTO DISABLE POWER#/DETECT PLUG 338 values based on NOR gate 324 logic states NOR Gate 324 Truth Table

| AUX CABLE PLUGGED# 333 | PE_PRESENT# 331 | AUTO DISABLE POWER#/DETECT PLUG 338 |
|---|---|---|
| 1 (don't enable power) | 1 (no card detected) | 0 (disable power/no plug) |
| 1 (don't enable power) | 0 (card detected) | 0 (disable power/no plug) |
| 0 (enable power) | 1 (no card detected) | 0 (disable power/no plug) |
| 0 (enable power) | 0 (card detected) | 1 (enable power/plug detected) |

The AUTO_DISABLE_POWER #/DETECT_PLUG signal 338 may be used by control processor 310 to determine whether a card 250 is fully plugged in and full power may be provided to the card through the slot 230 and, if appropriate, auxiliary power 240. Alternately, AUTO_DISABLE_POWER #/DETECT_PLUG signal 338 may indicate to control processor 310 when one of the connections is not connected, and the power to the card should be disabled.

When signal 338 indicates to control processor 310 that the card 250 is fully connected, the control processor 310 may activate signal SLOT POWER ENABLE along line 332. SLOT POWER ENABLE 332 may be provided to AND gate 326, along with a signal 336 from NOR gate 324. When these signals indicate that the card 250 is fully connected (via signal 336) and power is authorized to be provided to the card 250 (via the SLOT POWER ENABLE signal 332), the AND gate 326 may generate a signal 339 that enables power to the card, via 12V ENABLE signal A and 3.3V ENABLE signal B. The enable signals 339 may be provided to limiter circuits 220 and 221 of FIG. 2, respectively. If the system 300 ever determines that one of auxiliary cable 240 or slot connection 230 has become disconnected (e.g., via signal 338 AUTO_DISABLE_POWER #/DETECT_PLUG), the control processor 310 may disable the POWER ENABLE signal 332, which can disable signal 339 and 12V ENABLE signal A and 3.3V ENABLE signal B.

The functional operation of system 300 from an initial state will now be described, according to certain embodiments. Starting with an empty slot and an unplugged 12V aux connector (e.g., no card is connected at either point), control processor 310 may be in an initialization state, where ENABLE_CABLE_DETECTION 340 is disabled by clearing it (e.g., setting a register or signal to 0). As shown in Table 1, an ENABLE_CABLE_DETECTION value of 0 may result in AND gate 323 output, AUX_CABLE_PLUGGED #333, to be 0. The AUX_CABLE_PLUGGED #333 value of 0 may "fake" a plugged result to the hardware logic of system 300, thereby giving an "enable power" indicator.

A 0 value from AUX_CABLE_PLUGGED #333 enables the system 300 to sense the card plug status PE_PRESENT #331 as it propagates through NOR gate 324, as an inverter function resulting in inverted output DETECT_PLUG 336. This can be seen in Table 2. When a card is detected as plugged in via DETECT_PLUG 336, it enables control processor 310 to enable 3.3V AUX power to the PCIe card via setting (e.g., to a value "1") ENABLE_STANDBY_POWER 334, which is provided to AND gate 325. Signal 335 from NOR gate 324 is still set to "1", AND gate 325 outputs a "1" value along line 337 as control signal "C", resulting in the 3.3V Aux power line being activated to the card slot. By doing so, control processor 310 can interrogate the VPD stored to the PCIe card, if present, to determine power requirements, and setup electronics and current limits appropriately.

If the VPD indicates that a 12V Aux power cable is required to operate the card, control processor 310 may wait for AUX_CABLE_PRESENT #330 to go low (0) before going to the next step. Once the auxiliary cable is connected, control processor 310 may enable cable detection via ENABLE_CABLE_DETECTION 340 by setting it (1). As shown in Table 1, once ENABLE_CABLE_DETECTION 340 is enabled (1), power is only authorized by AND gate 323 when a cable is also connected (indicated via AUX_CABLE_PRESENT #330 set to 0). In some embodiments, the control processor 310 may set ENABLE_CABLE_DETECTION 340 to (1) without waiting for the cable connection, but this would deactivate the 3.3V AUX power.

At this point, a card has been detected as connected at both the slot and, if appropriate, the auxiliary cable connection. After a period has elapsed and the cable is still present, control processor 310 may turn on slot power by setting (e.g., to "1") SLOT POWER ENABLE 332. The gathered information on connection status and power status can also be passed to other devices for further uses, such as telemetry limits and plug states.

In situations where the 3.3V AUX power is enabled (via line 337, "C") but VPD is not present on the PCIe card, or there is insufficient data to determine power requirements, control processor 310 may wait for a timeout period to elapse while monitoring for AUX_CABLE PRESENT #330 to go low (0). If AUX_CABLE_PRESENT #330 goes low (0), control processor 310 may enable cable detection via ENABLE_CABLE_DETECTION 340 by setting it (1). However, if a timeout event occurs without AUX_CABLE_PRESENT #going low (0), control processor 310 may turn on slot power by setting SLOT POWER ENABLE 332 to (1), on the assumption the 12V aux power cable is not used. To further improve a robust system, a timer thread can be employed for this unknown card that periodically examines AUX_CABLE_PRESENT #330. On detection of this signal going low (0), the control processor 310 may set ENABLE_CABLE_DETECTION 340 to (1), and thereby monitor for the cable becoming disconnected as a trigger to cut off power to the card. Additionally, or in lieu of this, the system 300 can examine the card through its primary interface (e.g., PCIe). Additional information may be collected through the primary interface to set up limits when is not obtained through sideband VPD or other means.

Of additional note: Although some of the control logic of system 300 may not be needed for plugging in a card, it may be important to remove power to the card if a 12V aux cable or the card is removed from its slot, to prevent damage to the card or to the circuits of the receiving system, such as system 300 or other motherboard components. Control processor 310 may determine the plug status of cards or auxiliary cables through the hardware logic of system 300, or by connecting signal lines, such as AUX_CABLE_PRESENT and PE_PRESENT #, directly to the control processor 310. Although not listed, each input signal to system 300 may be protected with TVS diodes. Additionally, the detection signals (e.g., AUX_CABLE_PRESENT #, PE_PRESENT #, and DETECT_PLUG) may be debounced to prevent false triggering.

Figure 4:
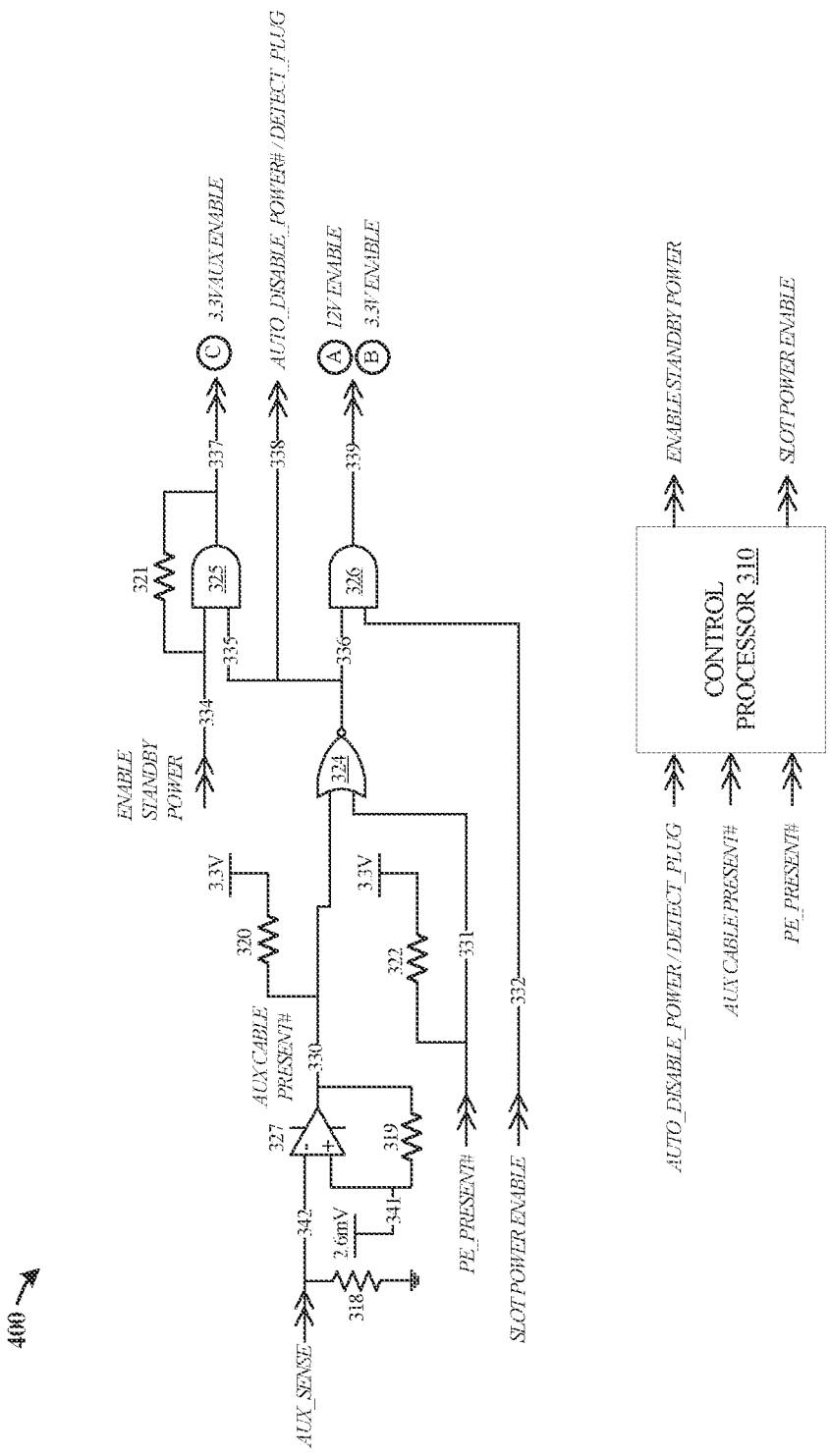
FIG. 4 is a diagram illustrating a power control circuit in an implementation.

Turning now to FIG. 4, a simplified version of the circuit of FIG. 3 is illustrated as system 400. System 400 differs from system 300 in that ENABLE CABLE DETECTION signal 340 and AND gate 323 have been removed. The system 400 may therefore always check for the auxiliary power connection 240, without the ability to turn auxiliary cable detection on or off with the ENABLE CABLE DETECTION signal. Example methods for detection of card connection or disconnection are discussed in regard to FIGS. 5 through 10.

Figure 5:
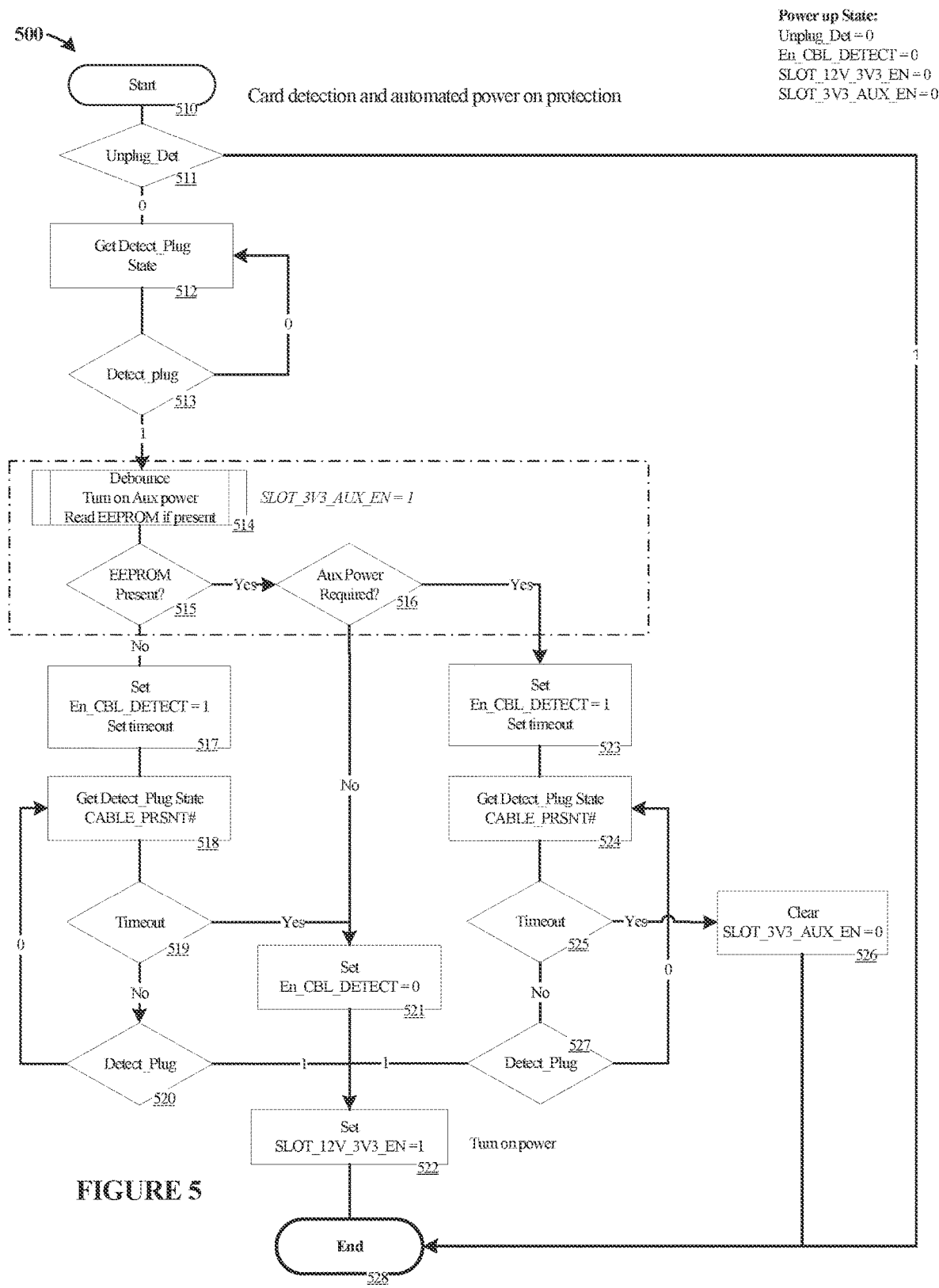
FIG. 5 is a diagram illustrating a process flow for card detection and power on protection in an implementation.

FIG. 5 depicts a flowchart 500 of an example method for card detection and automated power on protection. The method of flowchart 500 may allow for enabling power to a card with built-in hardware lockouts to disable or prevent power from being applied when a card is not fully connected, in particular while connecting a card to a live system. The method may be implemented using minimal pins to a logic integrated circuit, such as a microcontroller or FPGA. In some examples, the method may be implemented via power control circuitry 110 of FIG. 1, control circuit 210 of FIG. 2, or control processor 310 of FIG. 3 or 4. In some examples, flowchart 500 may correspond to an embodiment as depicted in FIG. 3, in which an ENABLE CABLE DETECTION line 340 is included.

The method may start at 510, where initial signal or variable values may be set such that Unplug_Det=0, ENABLE CABLE DETECTION/En_CBL_DETECT 340=0, SLOT POWER ENABLE/SLOT_12V_3V3_EN 332=0, and ENABLE STANDBY POWER/ SLOT_3V3_AUX_EN 334=0. Unplug_Det may be a static variable, which may be stored in the control processor 210 or 310 or elsewhere, and may be used to prevent repowering on a slot when a card is disconnected until the variable is cleared. A value of "0" may indicate power can be activated to a card. Unplug_Det may be checked at power on, set to "1" when a disconnect is detected, and cleared in the removal code when a card has been fully removed. En_CBL_DETECT 340 being set to 0 means no cable detection is required to indicate a card is connected (e.g., via NOR gate 324), so DETECT_PLUG 338 can indicate a connected card before a cable status is determined. SLOT_12V_3V3_EN 332 and SLOT_3V3_AUX_EN 334=0 means main power and standby power to a card slot may be initially disabled.

Before providing power to a slot, unplug detection may be performed, at 511, for example based on an Unplug_Det signal or variable. Unplug detection may include determining if either the slot or auxiliary power cable connection for a powered-on card has been disconnected, as illustrated in example methods of FIGS. 9 and 10. When Unplug_Det is set to "1", an unplug occurred and the system has not yet reset to allow power to be re-applied to a card. An Unplug_Det value of "0" may mean that the system is reset and ready to power a card. If an unplug is detected, the method may end, at 528, and not allow a card to be powered on.

When Unplug_Det is "0," the method may include detecting a plug state for a card slot, at 512. Detecting the plug state may include checking the DETECT_PLUG signal 338 of FIGS. 3 and 4. With En_CBL_DETECT 340 set to 0, DETECT_PLUG 338 may indicate when a PCIe card is inserted into a peripheral slot or port on a computer mainboard for example, such as PCIe connector 230 of FIG. 2. A determination may be made whether a card is plugged in, at 513. For example, if DETECT_PLUG 338 is 0, a card may not be plugged in, while a value of 1 may indicate a card is plugged in. If no card is detected, the method may include continuing to determine the card plugged state at 512.

When a card is plugged in, the method may include, at 514, implementing debouncing (e.g. to prevent false plug or unplug determinations due to erratic signals from the contacts of the card as it is inserted into the slot), activating auxiliary slot power (e.g., by turning on a 3.3V eFuse or limiter circuit 222 for the 3.3V auxiliary power line, setting SLOT_3V3_AUX_EN signal 334 to 1), and using the auxiliary slot power to read an EEPROM or other VPD source, if present in the card. A determination may be made whether an EEPROM is present in the card, at 515, for example based on the attempt to read the EEPROM at 514.

If an EEPROM is present, card details read from the EEPROM may be used to determine whether an auxiliary power connection, such as a 12V auxiliary power cable connection 240, is required for operation of the card, at 516. In some examples, the power requirements may be stored in the EEPROM directly, or may be determined by cross-referencing an identifier for the card stored to the EEPROM to a table in a memory of the computing system that indicates power requirements for different card types. In some examples, a determination may also be made for an amount of required power for operation of the card, which can be used to set current limits for the primary slot power line, for the auxiliary power connector line, or both, e.g., using limiter circuits or eFuses 220-222 of FIG. 2.

If no auxiliary power is required, at 516, the method may include setting or maintaining the ENABLE CABLE DETECTION/En_CBL_DETECT signal 340 to "0" or false, at 521. This may disable checks that require an auxiliary power cable be connected before powering on the card. At 522, the method may then include setting the SLOT POWER ENABLE/SLOT_12V_3V3_EN signal 332 to "1", which in turn may trigger power being provided to the card through the slot. The method may end, at 528.

Alternately, if the EEPROM does indicate auxiliary power is required, at 516, the method may include setting the ENABLE CABLE DETECTION signal 340 to "1," and optionally setting a timeout value in case no cable is connected, at 523. Alternately, another signal may be provided to end a loop where no cable is connected. By setting ENABLE CABLE DETECTION to 1, the DETECT_PLUG value become 0 unless or until an auxiliary cable connection 240 is connected, thereby prohibiting main power application to the card until both the slot and the auxiliary cable are connected. The method may therefore include getting a plug state for the auxiliary power connection, at 524. The connection status of the auxiliary cable can be determined via the DETECT_PLUG signal 338 as described, or through other signals such as CABLE_PRSNT #330. At 525, the timeout period may be checked, to see if the timeout value has been reached without an auxiliary cable being connected. Alternately, another signal or "bail" condition may be provided to end a loop where no card cable is connected, such as allowing a user to cancel a card insertion through a UI interface or removing the inserted card. If the timeout period has elapsed, at 526 the method may include clearing set variables such as SLOT_3V3_AUX_EN to 0, passing an error to a user through a user interface, and ending the method at 528. If the timeout period has not elapsed, the method may include making a determination of whether the auxiliary connection or cable is plugged in, at 527. If the auxiliary cable is not plugged in (e.g., DETECT_PLUG=0), the method may include continuing to monitor the plug state, at 524. If the cable is determined to be plugged in (e.g., DETECT_PLUG=1), the method may include setting the SLOT POWER ENABLE/SLOT_12V_3V3_EN signal 332 to "1" at 522, which in turn may trigger power being provided to the card through the slot and the auxiliary power connection. The method may then end, at 528.

If a determination is made that the card does not include an EEPROM or other source of information indicating whether auxiliary power is required, at 515, the method may include setting the ENABLE CABLE DETECTION/En_CBL_DETECT signal 340 to "1" (e.g., thereby setting DETECT_PLUG to 0 if no auxiliary cable is detected), and setting a timeout value at 517. When it is unknown whether the card requires auxiliary power, the timeout may be used to provide sufficient time to connect an auxiliary cable if one is required, which connection may then be detected. However, if no auxiliary cable is connected by the timeout period, the method may proceed as though the card does not require an auxiliary power connection. The timeout period may be set by a manufacturer of the computing system, or may be set by a user or host system to a desired value.

The method may include determining a plug state for the auxiliary power connection 240, at 518, which may include obtaining the value of the DETECT_PLUG signal 338, or the CABLE_PRSNT #330 signal, in some examples. The method may include determining whether the timeout value has expired, at 519. If the timeout has expired, the method may include proceeding on the assumption that no auxiliary power is required, and setting an ENABLE CABLE DETECTION signal 340 to "0" or false, at 521. If the timeout has not expired, the method may include making a determination of whether the auxiliary connection or cable is plugged in, at 520. If the auxiliary cable is not plugged in, the method may include continuing to monitor the plug state, at 518. If the cable is determined to be plugged in at 520, or cable detection was set to "0" at 521, the method may include setting the SLOT POWER ENABLE signal 332 to "1" at 522, which in turn may trigger power being provided to the card through the slot, and if appropriate, the auxiliary power connection. The method may end, at 526.

Figure 6:
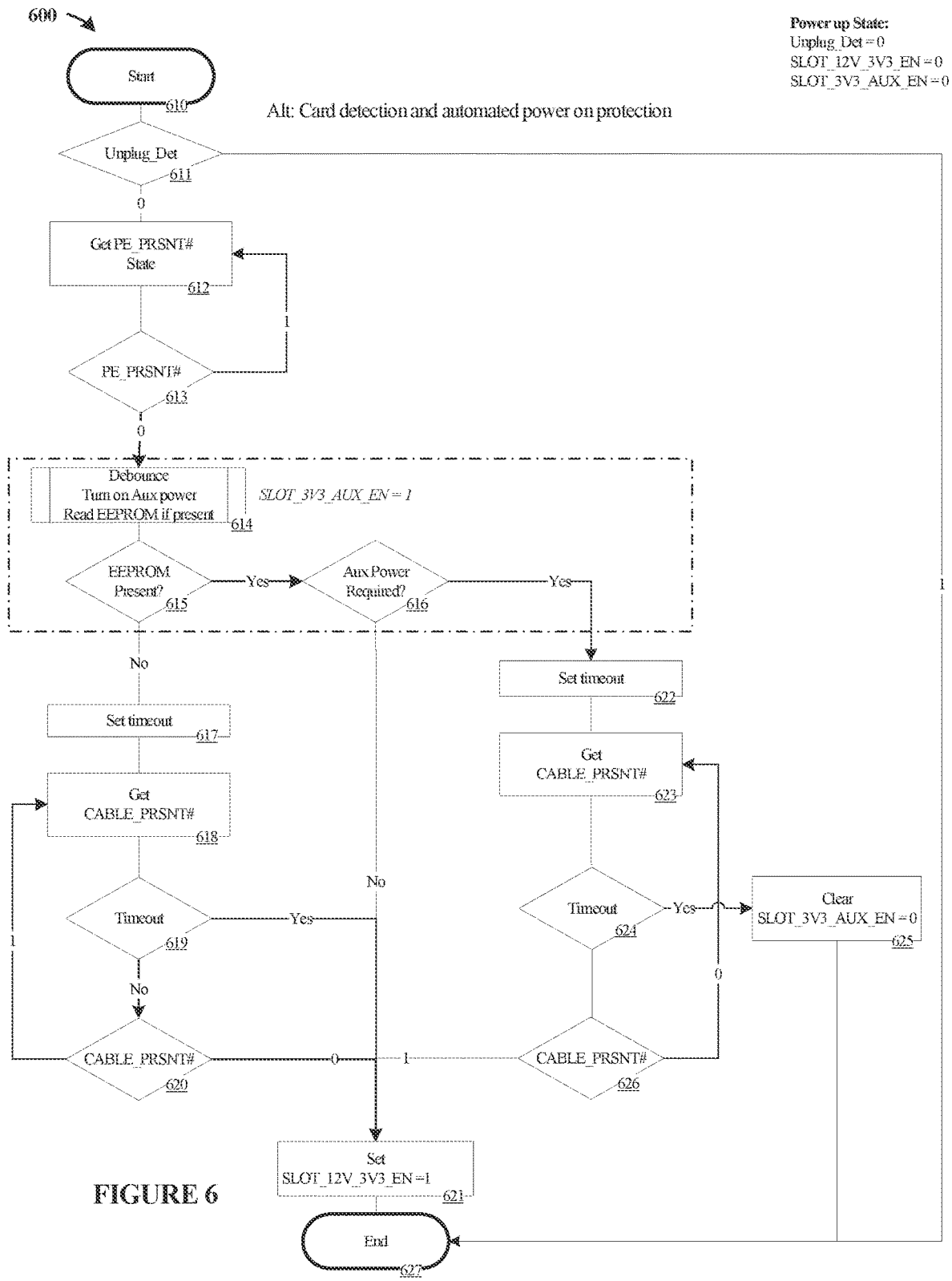
FIG. 6 is a diagram illustrating a process flow for card detection and power on protection in an implementation.

FIG. 6 depicts a flowchart 600 of another example method for card detection and automated power on protection. Similar to FIG. 5, the method of flowchart 600 may allow for enabling power to a card with built-in hardware lockouts to disable or prevent power from being applied when a card is not fully connected. The method of flowchart 600 may utilize one or more additional pins to a logic integrated circuit, such as a microcontroller or FPGA, relative to the method of FIG. 5. For example, AUX CABLE PRESENT #/CABLE_PRSNT #and PE_PRESENT #lines may be connected to control processor 310, which may not be utilized in the embodiment of FIG. 5. The circuitry employed to implement the method of FIG. 6 may include power control circuitry 110 of FIG. 1, control circuit 210 of FIG. 2, or control processor 310 of FIG. 3 or 4. In some examples, flowchart 600 may correspond to an embodiment as depicted in FIG. 4, in which no ENABLE CABLE DETECTION line is included.

The method may start at 610. As with FIG. 5, initial signal values may be set such that Unplug_Det=0, SLOT POWER ENABLE/SLOT_12V_3V3_EN 332=0, and ENABLE STANDBY POWER/SLOT_3V3_AUX_EN 334=0. The method may include performing unplug detection, at 611, for example based on an Unplug_Det signal or variable. Unplug detection may include determining if either the slot or auxiliary power cable connection for a powered-on card has been disconnected, as illustrated in example methods of FIGS. 9 and 10. When Unplug_Det is set to "1", an unplug may have occurred and the system has not yet reset to allow power to be re-applied to a card. An Unplug_Det value of "0" may mean that the system is reset and ready to power a card. If an unplug is detected, the method may end, at 626, and not allow a card to be powered on.

At 612, the method may include detecting a plug state for a card slot. Detecting the plug state may include checking the PE_PRESENT #/PE_PRSNT #signal 331 of FIGS. 3 and 4, which may directly indicate whether a card has been inserted into the slot. A determination may be made whether a card is plugged in, at 613. For example, if PE_PRSNT #has a value of 0, it may indicate a card is plugged in, and a value 1 may indicate no card is plugged in. If no card is detected, the method may include continuing to determine the card plugged state at 612.

When a card is plugged in, the method may include, at 614, implementing debouncing (e.g. to prevent false plug or unplug determinations due to erratic signals from the contacts of the card as it is inserted into the slot), activating auxiliary slot power (e.g., by turning on a 3.3V eFuse or limiter circuit 222 for the 3.3V auxiliary power line, setting SLOT_3V3_AUX_EN signal 334 to 1), and using the auxiliary slot power to read an EEPROM or other VPD source, if present in the card. A determination may be made whether an EEPROM is present in the card, at 615, for example based on the attempt to read the EEPROM.

If an EEPROM is present, card details read from the EEPROM may be used to determine whether an auxiliary power connection, such as a 12V auxiliary power cable connection 240, is required for operation of the card, at 616. In some examples, the power requirements may be stored in the EEPROM directly, or may be determined by cross-referencing an identifier for the card stored to the EEPROM to a table in a memory of the computing system that indicates power requirements for different card types. In some examples, a determination may also be made for an amount of required power for operation of the card, which can be used to set current limits for the primary slot power line, for the auxiliary power connector line, or both, e.g., using limiter circuits or eFuses 220-222 of FIG. 2.

If no auxiliary power is required, at 616, the method may include setting the SLOT POWER ENABLE/SLOT_12V_3V3_EN signal 332 to "1", at 621, which in turn may trigger power being provided to the card through the slot. The method may end, at 627.

Alternately, if the EEPROM does indicate auxiliary power is required, at 616, the method may include setting a timeout value at 622, to exit the process if no cable is connected after a period of time. Alternately, another signal or "bail" condition may be provided to end a loop where no cable is connected, such as allowing a user to cancel a card insertion through a UI interface or removing the inserted card. The method may then include getting a CABLE_PRSNT #330 state for the auxiliary power connection, at 623. At 624, the timeout period or other bail condition may be checked, to see if an exit condition has been reached without an auxiliary cable being connected. If the timeout period has elapsed, the method may include clearing set variables such as SLOT_3V3_AUX_EN to 0, passing an error to a user through a user interface, or otherwise cancelling the card insertion operation, at 625. The method may then end at 627. If the timeout period has not elapsed, the method may include making a determination of whether the auxiliary connection or cable is plugged in, at 626, for example based on a state of the AUX CABLE PRESENT #/CABLE_PRSNT #signal 330. If the auxiliary cable is not plugged in (e.g., CABLE_PRSNT #=1), the method may include continuing to monitor the plug state, at 623. If the cable is determined to be plugged in (e.g., CABLE_PRSNT #=0), the method may include setting the SLOT POWER ENABLE/SLOT_12V_3V3_EN signal 332 to "1" at 621, which in turn may trigger power being provided to the card through the slot and the auxiliary power connection. The method may then end, at 627.

If a determination is made that the card does not include an EEPROM or other source of information indicating whether auxiliary power is required, at 615, the method may include setting a timeout value at 617. When it is unknown whether the card requires auxiliary power, the timeout may be used to provide sufficient time to connect an auxiliary cable if one is required, which connection may then be detected. However, if no auxiliary cable is connected by the timeout period, the method may proceed as though the card does not require an auxiliary power connection. The timeout period may be set by a manufacturer of the computing system, or may be set by a user or host system to a desired value.

The method may include determining a plug state for the auxiliary power connection 240, at 618, which may include obtaining the value of the CABLE_PRSNT #signal 330, in some examples. The method may include determining whether the timeout value has expired, at 619. If the timeout has not expired, the method may include making a determination of whether the auxiliary connection or cable is plugged in, at 620, for example based on the CABLE_PRSNT #signal 330. If the auxiliary cable is not plugged in, the method may include continuing to monitor the plug state, at 618. If the cable is determined to be plugged in at 620, or the timeout period expired at 619, the method may include setting the SLOT POWER ENABLE/ SLOT_12V_3V3_EN signal 332 to "1" at 621, which in turn may trigger power being provided to the card through the slot, and if appropriate, the auxiliary power connection, depending on the CABLE_PRSNT #330 value, or whether a cable was connected or the timeout period expired. The method may end, at 627.

Figure 7:
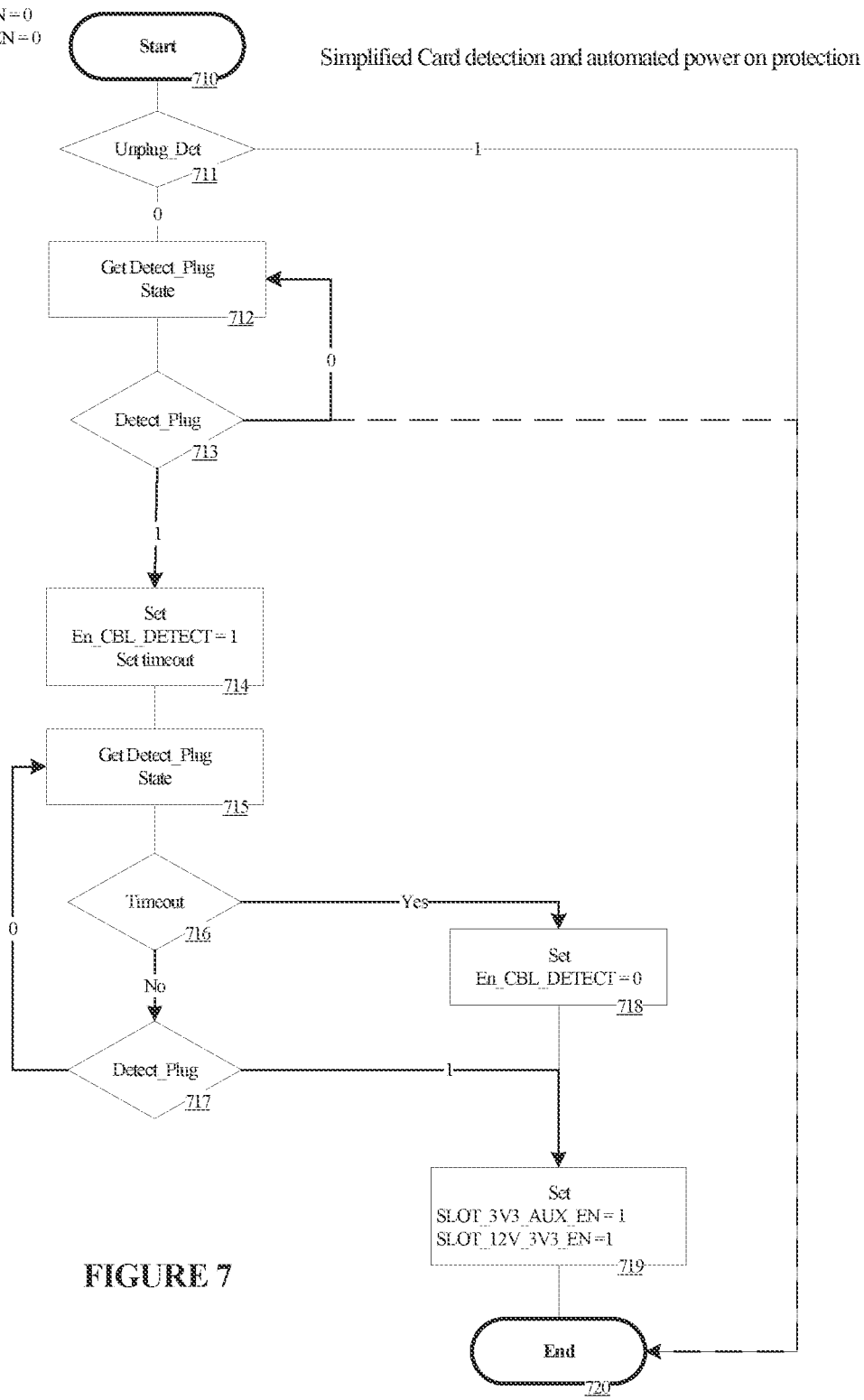
FIG. 7 is a diagram illustrating a process flow for card detection and power on protection in an implementation.

Turning now to FIG. 7, a flowchart 700 of another example method for card detection and automated power on protection is depicted. The method of FIG. 7 may be a simplified method compared to the methods of FIGS. 5 and 6, but may share similar operations and determination steps, which may not be described again in full detail for brevity. The method of flowchart 700 may allow for enabling power to a card with built-in hardware lockouts to disable or prevent power from being applied when a card is not fully connected. The method may be implemented via power control circuitry 110 of FIG. 1, control circuit 210 of FIG. 2, control processor 310 of FIG. 3 or 4, or through other circuits and modules. As used herein, modules may include one or more physical components of a computing device (e.g., logic, circuits, processors, etc.) configured to perform a particular task or job, or may include instructions that, when executed, can cause a processor to perform a particular task or job, or any combination thereof. In some examples, flowchart 700 may correspond to an embodiment as depicted in FIG. 3, in which an ENABLE CABLE DETECTION line 340 is included.

The method may start at 710, with initial values for Unplug_Det=0, ENABLE CABLE DETECTION/En_ CBL_DETECT 340=0, SLOT POWER ENABLE/ SLOT_12V_3V3_EN 332=0, and ENABLE STANDBY POWER/SLOT_3V3_AUX_EN 334=0. En_CBL_DETECT 340 being set to 0 may mean that no cable detection is required to indicate a card is connected (e.g., via NOR gate 324), so DETECT_PLUG 338 can indicate a connected card before a cable status is determined. SLOT_12V_3V3_EN 332 and SLOT_3V3_AUX_EN 334=0 means main power and standby power to a card slot may be initially disabled.

The method may include performing unplug detection, at 711, for example based on an Unplug_Det signal or variable. Unplug detection may include determining if either the slot or auxiliary power cable connection for a powered-on card has been disconnected, as illustrated in example methods of FIGS. 9 and 10. When Unplug_Det is set to "1", an unplug may have occurred and the system has not yet reset to allow power to be re-applied to a card. An Unplug_Det value of "0" may mean that the system is reset and ready to power a card. If an unplug is detected, the method may end, at 720, and not allow power up. If an unplug is not detected, the method may continue to 712.

At 712, the method may include detecting a plug state for a card slot, for example by checking the DETECT_PLUG signal 338 of FIGS. 3 and 4. A determination may be made whether a card is plugged in, at 713, for example based on the value of the DETECT_PLUG signal 338. If no card is detected, the method may include continuing to get the card plugged state at 712, or alternately ending the method at 720.

When a card is plugged in, the method may include setting the ENABLE CABLE DETECTION/En_CBL_DETECT signal 340 to "1," and setting a timeout value at 714. The simplified method of FIG. 7 may forego enabling auxiliary slot power to attempt to read an EEPROM from the card or otherwise attempt to determine whether the card requires an auxiliary power source. Accordingly, the method of FIG. 7 may rely on a timeout to provide time for an auxiliary cable to be connected to a card, and to proceed as though no auxiliary cable is required if the timeout expires.

After setting the ENABLE CABLE DETECTION signal 340 to "1," the method may include determining a plug state for the auxiliary power connection 240, at 715. The auxiliary cable plug state may be determined based on the value of the DETECT_PLUG signal 338 of FIGS. 3 and 4, in some examples. With En_CBL_DETECT set to "1", the DETECT_PLUG signal may be "0" until both an auxiliary cable and the cable slot plugs are detected. The method may include determining whether the timeout period has expired, at 716. If the timeout has expired, the method may include proceeding on the assumption that no auxiliary power is required, and setting an ENABLE CABLE DETECTION signal 340 to "0" or false, at 718. If the timeout has not expired, the method may include making a determination of whether the auxiliary connection or cable is plugged in, at 717, for example based on the DETECT_PLUG signal 338. If the auxiliary cable is not plugged in, the method may include continuing to monitor the plug state, at 715. If the cable is determined to be plugged in at 717, or cable detection was set to "0" at 718, the method may include setting the ENABLE STANDBY POWER/ SLOT_3V3_AUX_EN signal to 1, and setting the SLOT POWER ENABLE/SLOT_12V_3V3_EN signal 332 to "1", at 719. The method may then end, at 720.

Figure 8:
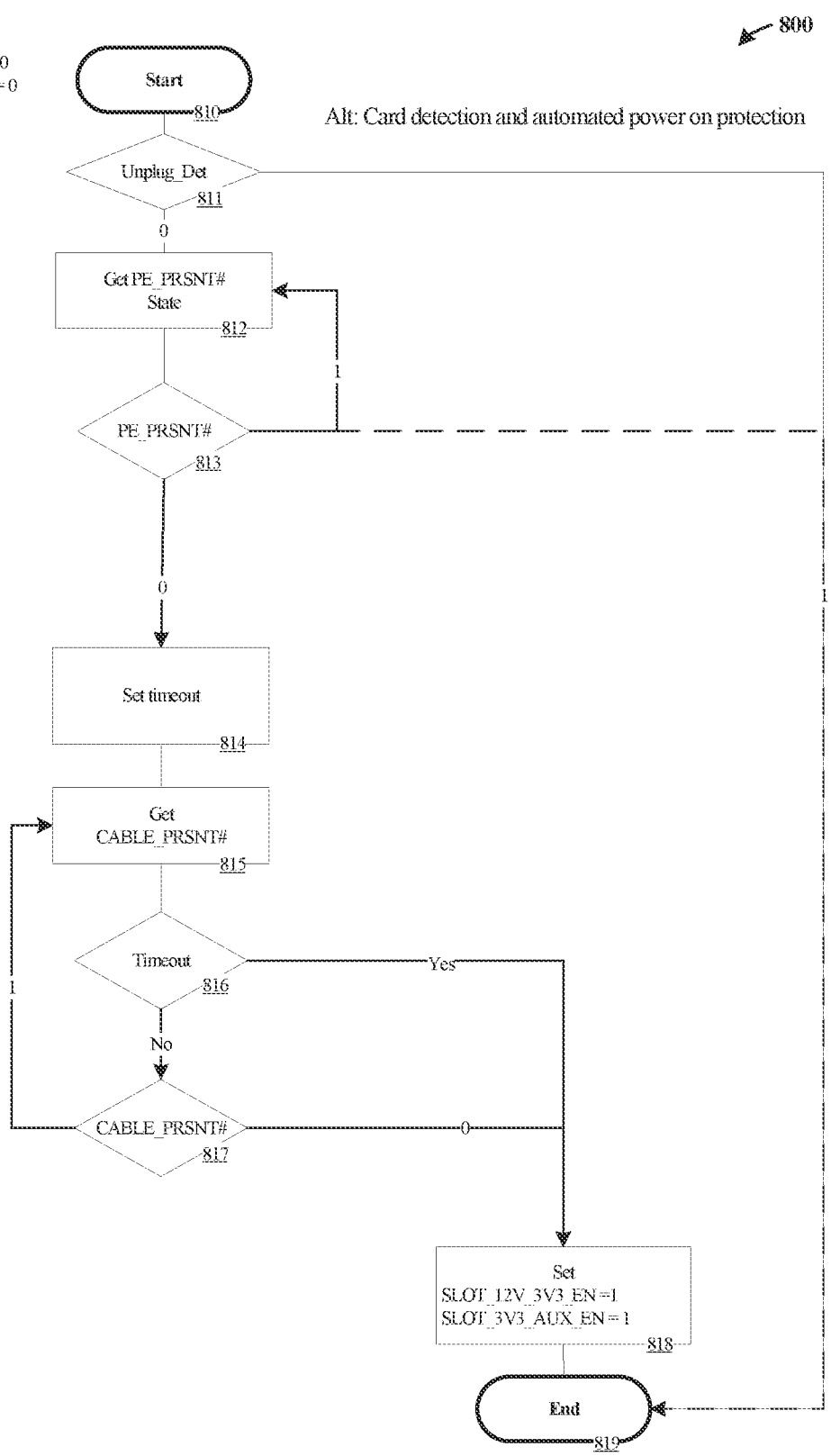
FIG. 8 is a diagram illustrating a process flow for card detection and power on protection in an implementation.

FIG. 8 depicts a flowchart 800 of another example of a simplified method for card detection and automated power on protection is depicted, relative to the methods of FIGS. 5 and 6. Similar operations and determination steps from previous flowcharts may not be described again in full detail for brevity. The method of flowchart 800 may allow for enabling power to a card with built-in hardware lockouts to disable or prevent power from being applied when a card is not fully connected. The method may be implemented via power control circuitry 110 of FIG. 1, control circuit 210 of FIG. 2, control processor 310 of FIG. 3 or 4, or other circuits or modules. In some examples, flowchart 800 may correspond to an embodiment as depicted in FIG. 4, in which no ENABLE CABLE DETECTION line is included.

The method may start at 810, where initial signal values may be set such that Unplug_Det=0, SLOT POWER ENABLE/SLOT_12V_3V3_EN 332=0, and ENABLE STANDBY POWER/SLOT_3V3_AUX_EN 334=0. SLOT_12V_3V3_EN 332 and SLOT_3V3_AUX_EN 334=0 means main power and standby power to a card slot may be initially disabled.

The method may include performing unplug detection, at 811, for example based on an Unplug_Det signal or variable. Unplug detection may include determining if either the slot or auxiliary power cable connection for a powered-on card has been disconnected, as illustrated in example methods of FIGS. 9, 10, and 12. When Unplug_Det is set to "1", an unplug may have occurred and the system has not yet reset to allow power to be re-applied to a card. An Unplug_Det value of "0" may mean that the system is reset and ready to power a card. If an unplug is detected, the method may end, at 820, and not allow power up.

At 812, the method may include detecting a plug state for a card slot. Detecting the plug state may include checking the PE_PRSNT #signal 331 of FIGS. 3 and 4. A determination may be made whether a card is plugged in, at 813, for example based on the value of the PE_PRSNT #signal 331. If no card is detected, the method may include continuing to get the card plugged state at 812, or alternately ending the method at 819.

When a card is plugged in, the method may include setting a timeout value at 814. The method may then include getting a connection state for the auxiliary power connection 240, at 815. The auxiliary cable state may be determined based on the value of an AUX CABLE PRESENT #/CABLE_PRSNT #signal 330 of FIGS. 3 and 4, in some examples. If the timeout has not expired, the method may include making a determination of whether the auxiliary connection or cable is plugged in, at 817, for example based on the AUX CABLE PRESENT #signal 330. If the auxiliary cable is not plugged in, the method may include continuing to monitor the plug state, at 815. If the cable is determined to be plugged in at 817, or the timeout period has expired at 816, the method may include setting the ENABLE STANDBY POWER signal to 1, and setting the SLOT POWER ENABLE signal 332 to "1", at 818. Whether power is provided to the auxiliary cable may depend on the value of CABLE_PRSNT #330, or whether a cable was detected at 817 or the timeout period expired at 816. The method may then end, at 819.

Figure 9:
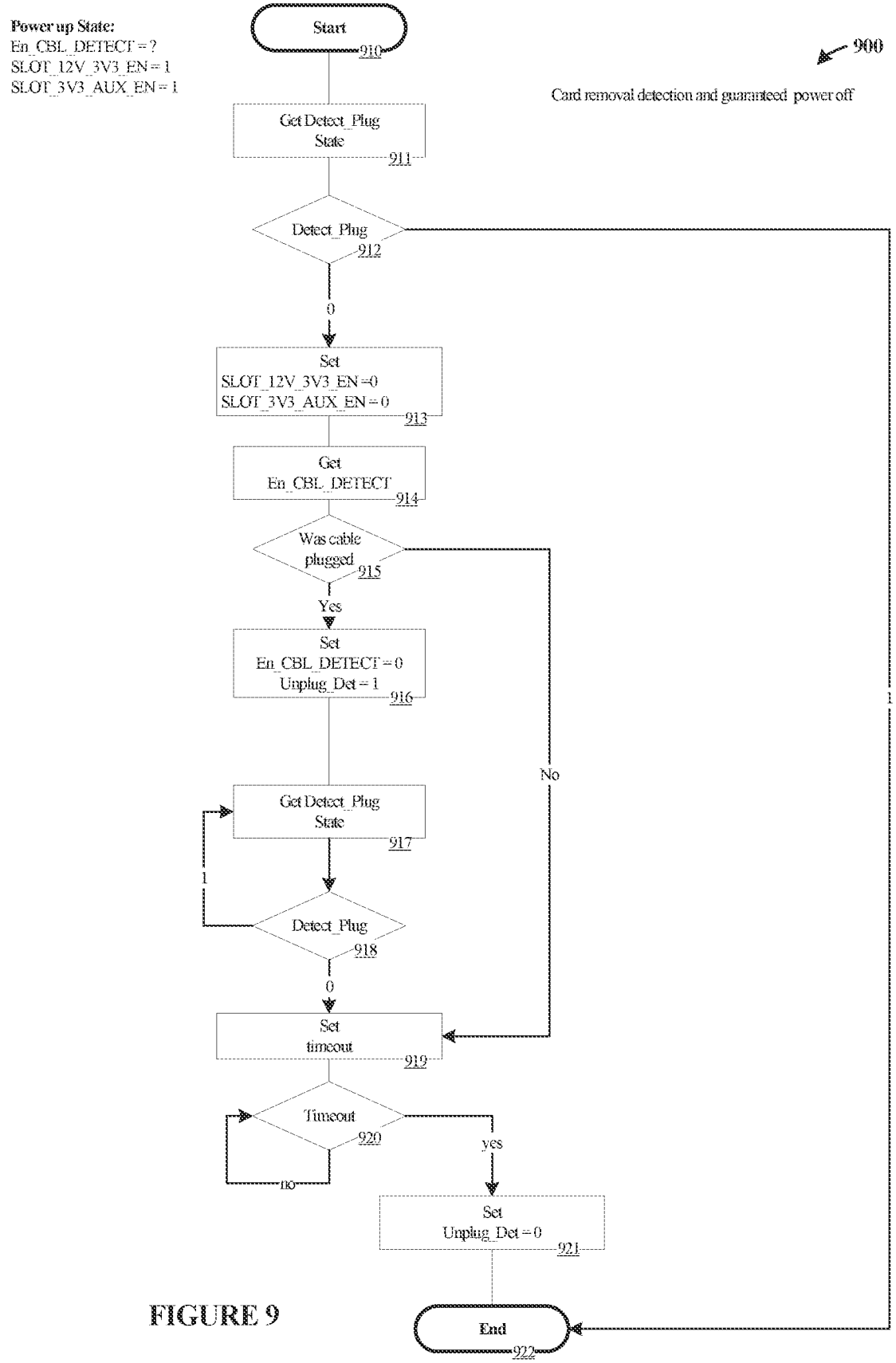
FIG. 9 is a diagram illustrating a process flow for card removal detection and power off protection in an implementation.

Turning now to FIG. 9, a flowchart 900 for a method for card removal detection and guaranteed power off is depicted. The method of flowchart 900 may allow for cutting off power to a card that is not fully connected, particularly in situations where a connected card may be removed from a live system. A system implanting the method of FIG. 9 may disable power with hardware lockouts, and disable hardware from turning power back on inadvertently when a card is not fully and properly connected at both a slot and via an auxiliary power connection, if applicable. This may be implemented by ensuring all power connected to card has been removed prior to allowing a new connection or turning power back on. The method may be implemented via power control circuitry 110 of FIG. 1, control circuit 210 of FIG. 2, control processor 310 of FIG. 3 or 4, or other circuits or modules. In some examples, flowchart 900 may correspond to an embodiment as depicted in FIG. 3, in which an ENABLE CABLE DETECTION line 340 is included.

The method may start at 910, with initial values for SLOT POWER ENABLE/SLOT_12V_3V3_EN 332=0, and ENABLE STANDBY POWER/SLOT_3V3_AUX_EN 334=0. ENABLE_CABLE_DETECTION/En_CBL_DETECT 340 may potentially be set to either 0 or 1, depending on whether an auxiliary power cable was connected for the inserted card (e.g., set to "0" if no cable is being used, or set to "1" if a cable is being used). The state of En_CBL_DETECT 340 may affect the behavior of signals such as DETECT_PLUG 338, which may become 0 if either the cable or card slot become disconnected (for En_CBL_DETECT=1), or only when the card slot is disconnected (for En_CBL_DETECT=0).

The method may include getting a plug state for a card, at 911. Detecting the plug state may include checking the DETECT_PLUG signal 338 of FIGS. 3 and 4, to determine whether a card has been disconnected at either the card slot 230 or the auxiliary power connection 240, as appropriate. A determination may be made whether a card is plugged in, at 912, for example based on the value of the DETECT_PLUG signal 338. If the card is fully plugged in, the method may end, at 922.

When a card is not fully plugged in, the method may include setting the SLOT POWER ENABLE signal 332 to "0," and setting the ENABLE STANDBY POWER signal 334 to "0," at 913. Setting these values to 0 may turn off power to the card, including the auxiliary slot power, the primary slot power, and the auxiliary cable power connection, and may be implemented instantly via hardware logic. Cutting off these power sources can prevent power from being turned back on at the card slot or auxiliary power connection until a full removal of the card occurs.

At 914, the method may include getting a state of the ENABLE CABLE DETECTION signal 340. The status of the ENABLE CABLE DETECTION signal 340 may indicate whether an auxiliary power connection 240 was connected for the card, for example based on how the signal 340 was set in methods 500 or 700. A determination may be made whether an auxiliary power cable was plugged in, at 915. If an auxiliary power connection was connected, the method may include changing the value of ENABLE CABLE DETECTION from "1" to "0," and setting an unplug detection signal or value Unplug_Det to "1", at 916. The Unplug_Det signal may be used to indicate when an unplug has occurred with a "1" value, and that the system has not been reset and ready to power another card until Unplug_Det is set to "0". If no auxiliary power connection was connected, ENABLE CABLE DETECTION was already set to "0" and may be kept in that state. Setting the ENABLE CABLE DETECTION to "0" may enable the DETECT_PLUG signal to indicate whether the card is still plugged in at the card slot.

At 917, the method may include getting the detect plug state, and at 918, making a determination of whether the card is fully unplugged, for example based on the DETECT_PLUG signal 338. If the card is still plugged in, the method may include continuing the monitor the DETECT_PLUG state, at 917. If the card is no longer connected, at 918, or if no cable was plugged in, at 915, the method may include setting a timeout period, at 919. The timeout period may be set to force hysteresis before allowing power to be restored to a card again. A determination may be made whether the timeout period has expired, at 920. If not, the method may include continuing to monitor the timeout period until it expires, at 920. Once the timeout period has expired, the method may include setting the unplug detection state (e.g., via an Unplug_Det signal) to 0, or otherwise allowing the system to recognize plugging in a card and enabling power to be restored to the card slot and auxiliary power connection. The method may then end, at 922.

Figure 10:
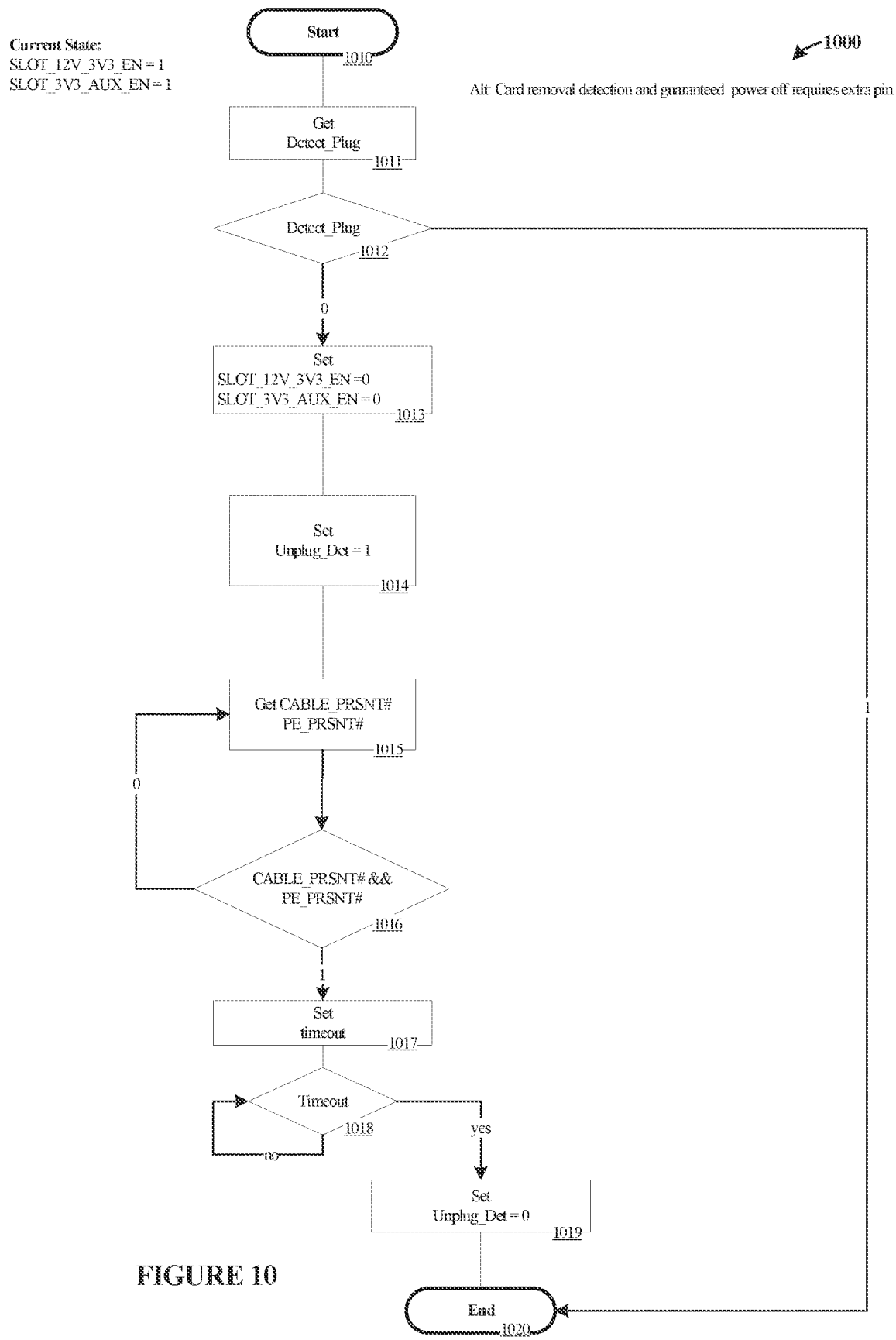
FIG. 10 is a diagram illustrating a process flow for card removal detection and power off protection in an implementation.

FIG. 10 depicts a flowchart 1000 of another example method for card detection and automated power on protection. Similar to FIG. 9, the method of flowchart 1000 may allow for cutting off power to a card that is not fully connected, particularly in situations where a connected card may be removed from a live system. The method of flowchart 1000 may utilize one or more additional pins to a logic integrated circuit, such as a microcontrontroller or FPGA, relative to the method of FIG. 9. The circuitry employed to implement the method of FIG. 1000 may include power control circuitry 110 of FIG. 1, control circuit 210 of FIG. 2, or control processor 310 of FIG. 3 or 4. In some examples, flowchart 1000 may correspond to an embodiment as depicted in FIG. 4, in which no ENABLE CABLE DETECTION line is included.

The method may start at 1010, with initial values for SLOT POWER ENABLE/SLOT_12V_3V3_EN 332=0, and ENABLE STANDBY POWER/SLOT_3V3_AUX_EN 334=0.

The method may include getting a plug state for a card, at 1011. Getting the plug state may include checking the DETECT_PLUG signal 338 of FIGS. 3 and 4, to determine whether a card has been disconnected at either the card slot 230 or the auxiliary power connection 240. A determination may be made whether a card is plugged in, at 1012, for example based on the value of the DETECT_PLUG signal 338. If the card is fully plugged in (DETECT_PLUG=1), the method may end, at 1020.

When a card is not fully plugged in (DETECT_PLUG=0), the method may include setting the SLOT POWER ENABLE signal 332 to "0," and setting the ENABLE STANDBY POWER signal 334 to "0," at 1013. Setting these values to 0 may turn off power to the card, including the auxiliary slot power, the primary slot power, and the auxiliary power connection, and may be implemented instantly via hardware logic. Cutting off these power sources can prevent power from being turned back on at the card slot or auxiliary power connection until a full removal of the card occurs.

The method of FIG. 10 may include proceeding without a need to determine whether an auxiliary power connection 240 was connected, and may skip the cable connection check 914-915 of FIG. 9. Accordingly, at 1014, the method may include setting an unplug detection signal or value Unplug_Det to "1". The Unplug_Det signal or value may be used to indicate when an unplug has occurred with a "1" value, and that the system has not been reset and ready to power another card until Unplug_Det is set to "0".

The method may include getting states for the CABLE_PRSNT #signal 330 and the PE_PRSNT #signal 331, at 1015. The status of CABLE_PRSNT #and PE_PRSNT #may indicate whether both the connector slot 230 and the auxiliary power connector 240 have been disconnected. A determination of whether both CABLE_PRSNT #and PE_PRSNT #are "0" (e.g., plugged) or "1" (e.g., unplugged) may be made at 1016. If both signals indicate the card is not unplugged, the method may continue monitoring the signal states, at 1015.

If both signals indicate the card is fully unplugged, the method may include setting a timeout period, at 1017. The timeout period may be set to force hysteresis before allowing power to be restored to a card again. A determination may be made whether the timeout period has expired, at 1018. If not, the method may include continuing to monitor the timeout period until it expires, at 1018. Once the timeout period has expired, the method may include setting the unplug detection state (e.g., via an Unplug_Det signal) to 0, or otherwise allowing the system to recognize plugging in a card and enabling power to be restored to the card slot and auxiliary power connection, at 1019. The method may then end, at 1020.

Figure 11:
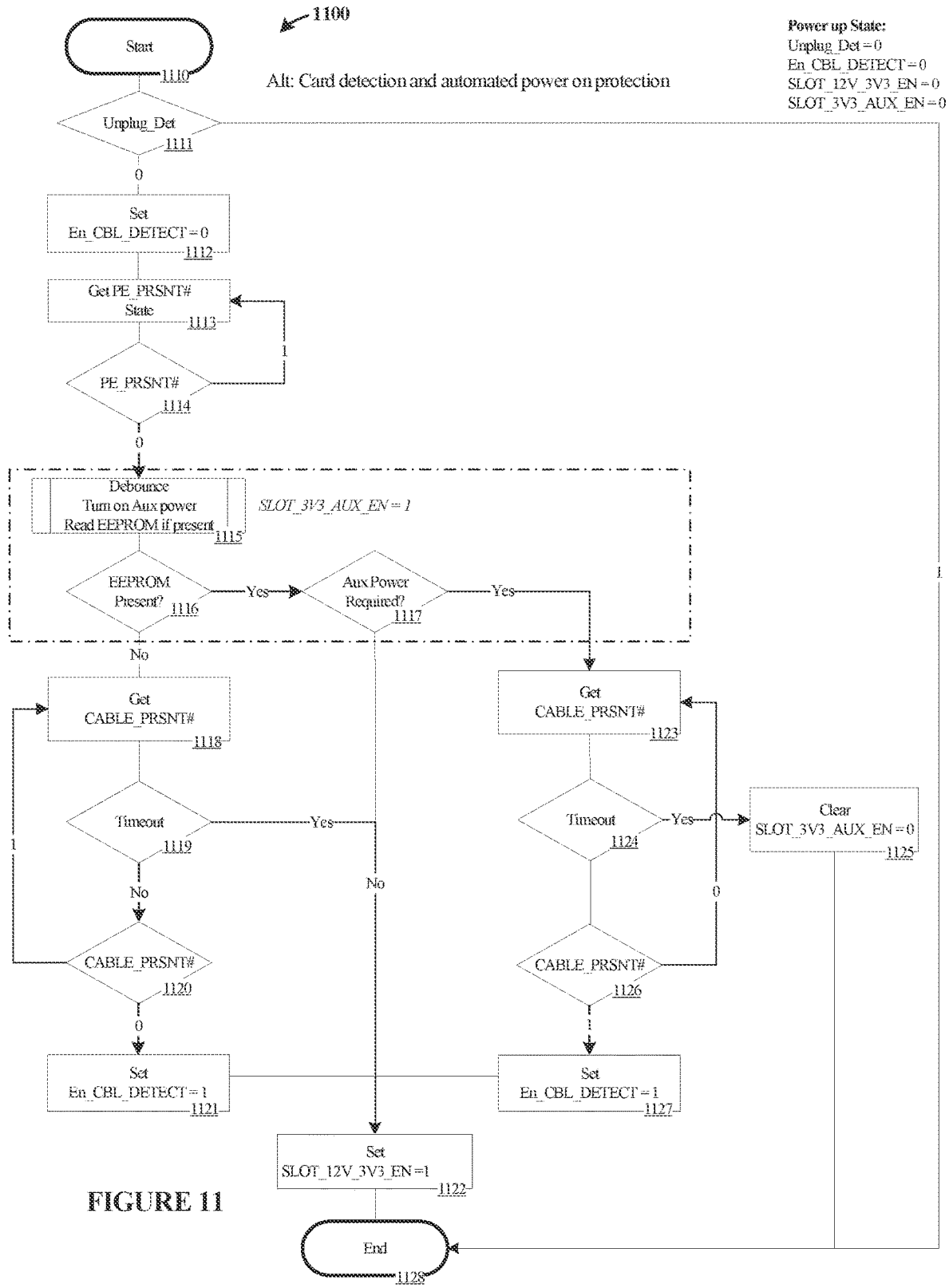
FIG. 11 is a diagram illustrating a process flow for card detection and power on protection in an implementation.

Turning now to FIG. 11, a flowchart 1100 of another example method for card detection and automated power on protection is shown. The method of flowchart 1100 may allow for enabling power to a card with built-in hardware lockouts to disable or prevent power from being applied when a card is not fully connected. The circuitry employed to implement the method of FIG. 11 may include power control circuitry 110 of FIG. 1, control circuit 210 of FIG. 2, or control processor 310 of FIG. 3 or 4. In some examples, flowchart 1100 may correspond to an embodiment as depicted in FIG. 3, in which an ENABLE CABLE DETECTION line 340 is included.

The method may start at 1110. To enable power to a newly inserted card, initial signal values should be set such that Unplug_Det=0, ENABLE CABLE DETECTION/En_CBL_DETECT=0, SLOT POWER ENABLE/SLOT_12V_3V3_EN 332=0, and ENABLE STANDBY POWER/SLOT_3V3_AUX_EN 334=0. The method may include performing unplug detection, at 1111, for example based on an Unplug_Det signal or variable. When Unplug_Det is set to "1", an unplug may have occurred and the system has not yet reset to allow power to be re-applied to a card. An Unplug_Det value of "0" may mean that the system is reset and ready to power a card. If an unplug is detected, the method may end, at 1128, and not allow a card to be powered on.

When Unplug_Det is 0, the method may include setting En_CBL_DETECT is set to 0, or setting it 0 if it is not already so set, at 1112. At 1113, the method may include detecting a plug state for a card slot. Detecting the plug state may include checking the PE_PRESENT #/PE_PRSNT #signal 331 of FIGS. 3 and 4, which may indicate whether a card has been inserted into the slot. A determination may be made whether a card is plugged in, at 114, for example based on the PE_PRSNT #value. If no card is detected, the method may include continuing to determine the card plugged state at 1113.

When a card is plugged in, the method may include, at 1115, implementing debouncing (e.g. to prevent false plug or unplug determinations due to erratic signals from the contacts of the card as it is inserted into the slot), activating auxiliary slot power (e.g., by turning on a 3.3V eFuse or limiter circuit 222 for the 3.3V auxiliary power line, setting SLOT_3V3_AUX_EN signal 334 to 1), and using the auxiliary slot power to read an EEPROM or other VPD source, if present in the card. A determination may be made whether an EEPROM is present in the card, at 1116, for example based on the attempt to read the EEPROM.

If an EEPROM is present, card details read from the EEPROM may be used to determine whether an auxiliary power connection, such as a 12V auxiliary power cable connection 240, is required for operation of the card, at 1117. In some examples, the power requirements may be stored in the EEPROM directly, or may be determined by cross-referencing an identifier for the card stored to the EEPROM to a table in a memory of the computing system that indicates power requirements for different card types. In some examples, a determination may also be made for an amount of required power for operation of the card, which can be used to set current limits for the primary slot power line, for the auxiliary power connector line, or both, e.g., using limiter circuits or eFuses 220-222 of FIG. 2.

If no auxiliary power is required, at 1117, the method may include setting the SLOT POWER ENABLE/SLOT_12V_3V3_EN signal 332 to "1", at 1122, which in turn may trigger power being provided to the card through the slot. The method may end, at 1128.

Alternately, if the EEPROM does indicate auxiliary power is required, at 1117, the method may include getting a connection status for an auxiliary cable, for example by checking a CABLE_PRSNT #330 state, at 1123. At 1124, a timeout period or other bail condition may be checked, to see if an exit condition has been reached without an auxiliary cable being connected. If the timeout period has elapsed, the method may include clearing set variables such as SLOT_3V3_AUX_EN to 0, passing an error to a user through a user interface, or otherwise cancelling the card insertion operation, at 1125. The method may then end at 1128. If the timeout period has not elapsed, the method may include making a determination of whether the auxiliary connection or cable is plugged in, at 1127, for example based on a state of the AUX CABLE PRESENT #/CABLE_PRSNT #signal 330. If the auxiliary cable is not plugged in (e.g., CABLE_PRSNT #=1), the method may include continuing to monitor the plug state, at 1123. If the cable is determined to be plugged in (e.g., CABLE_PRSNT #=0), the method may include setting En_CBL_DETECT to 1, at 1127, which may thereby require the auxiliary cable to remain connected while the card is plugged in. The method may include setting the SLOT POWER ENABLE/SLOT_12V_3V3_EN signal 332 to "1" at 1122, which in turn may trigger power being provided to the card through the slot and the auxiliary power connection. The method may then end, at 1128.

Returning to the decision of 1116, if a determination is made that the card does not include an EEPROM or other source of information indicating whether auxiliary power is required, the method may include getting a plug state for the auxiliary power connection 240, at 1118, which may include obtaining the value of the CABLE_PRSNT #signal 330. The method may include determining whether a timeout value has expired, at 1119. When it is unknown whether the card requires auxiliary power, the timeout may be used to provide sufficient time to connect an auxiliary cable if one is required, which connection may then be detected. However, if no auxiliary cable is connected by the timeout period, the method may proceed as though the card does not require an auxiliary power connection. The timeout period may be set by a manufacturer of the computing system, or may be set by a user or host system to a desired value. If the timeout has not expired, the method may include making a determination of whether the auxiliary connection or cable is plugged in, at 1120, for example based on the CABLE_PRSNT #signal 330. If the auxiliary cable is not plugged in, the method may include continuing to monitor the plug state, at 1118. If the cable is determined to be plugged in at 1120, the method may include setting En_CBL_DETECT to 1 at 1121, so that power can be shut off if the cable becomes disconnected. After setting En_CBL_DETECT to 1 at 1121, or the timeout period expired at 1119, the method may include setting the SLOT POWER ENABLE/SLOT_12V_3V3_EN signal 332 to "1" at 1122, which in turn may trigger power being provided to the card through the slot, and if appropriate, the auxiliary power connection, depending on the CABLE_PRSNT #330 value, the En_CBL_DETECT value, or whether a cable was connected or the timeout period expired. The method may end, at 1128.

Figure 12:
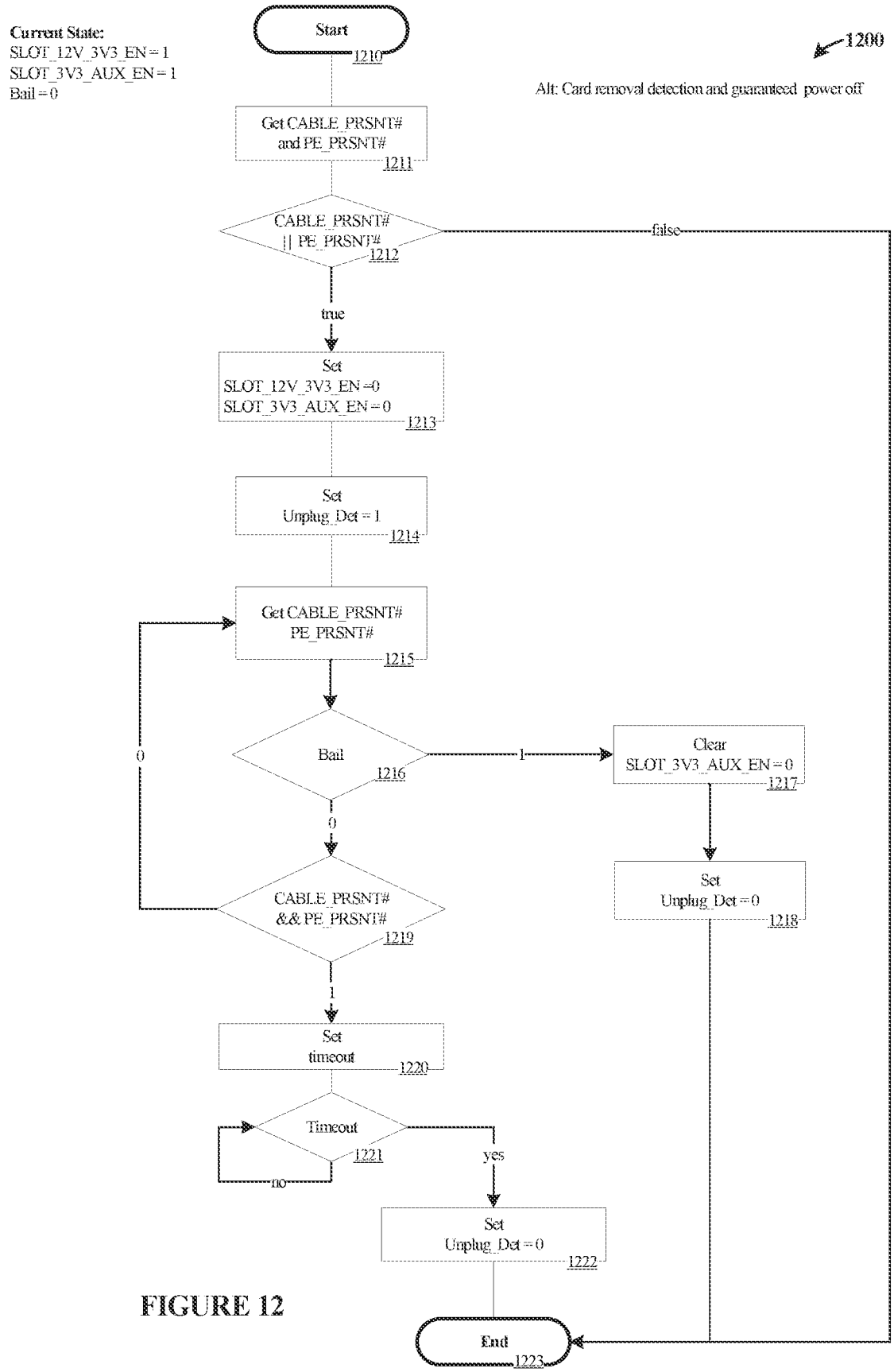
FIG. 12 is a diagram illustrating a process flow for card removal detection and power off protection in an implementation.

FIG. 12 depicts a flowchart 1200 of another example method for card detection and automated power on protection. The method of flowchart 1200 may allow for cutting off power to a card that is not fully connected, particularly in situations where a connected card may be removed from a live system, allowing for slot-specific power control. The circuitry employed to implement the method of FIG. 1200 may include power control circuitry 110 of FIG. 1, control circuit 210 of FIG. 2, or control processor 310 of FIG. 3 or 4.

The method may start at 1210, with initial values for SLOT POWER ENABLE/SLOT_12V_3V3_EN 332=0, ENABLE STANDBY POWER/SLOT_3V3_AUX_EN 334=0, and a "Bail" variable or value of "0". The Bail value may be used to determine whether to exit the operations of flowchart 1200 if an expected trigger or occurrence does not happen. Although Bail may be implemented as a bit flag or register value, alternate methods of exiting the process may be employed, such as timeout periods or user inputs.

The method may include getting a plug state for a card, at 1211. Getting the plug state may include checking the CABLE_PRSNT #330 and PE_PRSNT #331 signal values of FIGS. 3 and 4, which may indicate whether a card is connected at the auxiliary cable 240 and the card port 230, respectively. A determination may be made whether a card has become disconnected at either element, at 1212, for example based on the values of CABLE_PRSNT #330 and PE_PRSNT #331. As these signals may be "0" when a connection is detected, a logical "OR" operator (||) may be used to determine whether either of these signals has changed to "1", indicating a disconnect. If the card is fully plugged in (a false result from the logical OR), the method may end, at 1223.

When a card is not fully plugged in (logical OR=true), the method may include setting the SLOT POWER ENABLE/SLOT_12V_3V3_EN signal 332 to "0," and setting the ENABLE STANDBY POWER/SLOT_3V3_AUX_EN signal 334 to "0," at 1213. Setting these values to 0 may turn off power to the card, including the auxiliary slot power, the primary slot power, and the auxiliary power connection, and may be implemented instantly via hardware logic. Cutting off these power sources can prevent power from being turned back on at the card slot or auxiliary power connection until a full removal of the card occurs. At 1214, the method may include setting Unplug_Det=1. Unplug_Det may be a variable or value which indicates whether a disconnect has occurred, and may prevent power being applied to a card slot until Unplug_Det is reset to 0 (see, e.g., FIGS. 5-8 and 10).

The method may include getting states for the CABLE_PRSNT #signal 330 and the PE_PRSNT #signal 331, at 1215. At 1216, a determination may be made whether the Bail condition has become "1", a timeout period has been reached, or some other trigger has occurred indicating the method should be exited to avoid an endless loop or hung operation. If the Bail condition has been triggered, the method may include clearing relevant variables or signals, such as setting SLOT_3V3_AUX_EN to 0, at 1217, clearing the Unplug_Det value to 0 at 1218, and ending the method at 1223.

If the Bail condition is not met, the method may include determining whether both CABLE_PRSNT #and PE_PRSNT #are "0" (e.g., plugged) or "1" (e.g., unplugged) at 1219, for example with a logical "AND" operator (&&). If the signals indicate the card is not fully unplugged at both cable and slot, the method may continue monitoring the signal states, at 1215. If both signals indicate the card is fully unplugged, the method may include setting a timeout period, at 1220. The timeout period may be set to force hysteresis before allowing power to be restored to a card again. A determination may be made whether the timeout period has expired, at 1221. If not, the method may include continuing to monitor the timeout period until it expires, at 1221. Once the timeout period has expired, the method may include setting the unplug detection state (e.g., via an Unplug_Det signal) to 0, or otherwise allowing the system to recognize plugging in a card and enabling power to be restored to the card slot and auxiliary power connection, at 1222. The method may then end, at 1223.

Although signal values of "0" or "1" are presented herein for various signal lines or system states for implementing the example systems in the circuit diagrams and flowcharts, it should be understood that these signal values or states are exemplary. The processes and systems disclosed herein may be implemented using other signal values, for example by modifying logic gates control line connections.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the present disclosure. Those skilled in the art will also appreciate that the features described above can be combined in various ways to form multiple implementations. As a result, the invention is not limited to the specific implementations described above, but only by the claims and their equivalents.

What is claimed is:

1. A method comprising:
   while maintaining a slot power connection and an auxiliary power connection for a peripheral card slot in a powered-off state, sensing insertion of a peripheral card into the peripheral card slot and responsively detecting whether the auxiliary power connection is employed by the peripheral card;
   based at least on detecting the auxiliary power connection is employed by the peripheral card, applying current limits selected for the peripheral card to the slot power connection and the auxiliary power connection and concurrently enabling the slot power connection and the auxiliary power connection for the peripheral card; and
   based at least on detecting the auxiliary power connection is not employed by the peripheral card, applying a current limit selected for the peripheral card to the slot power connection and enabling only the slot power connection for the peripheral card.

2. The method of claim 1, further comprising:
   responsive to sensing insertion of the peripheral card into the peripheral card slot, determining power requirement properties of the peripheral card, and adjusting the current limits selected for the peripheral card to at least meet the power requirement properties.

3. The method of claim 1, further comprising:
   based at least on detecting the auxiliary power connection is employed by the peripheral card, sensing connection of the auxiliary power connection to the peripheral card; and
   enabling the slot power connection and the auxiliary power connection only when both the insertion of the peripheral card and connection of the auxiliary power connection are concurrently detected.

4. The method of claim 1, further comprising:
   responsive to sensing insertion of the peripheral card into the peripheral card slot, enabling an auxiliary standby power connection to the peripheral card; and
   accessing a data store of the peripheral card using the auxiliary standby power connection to detect whether the auxiliary power connection is employed by the peripheral card.

5. The method of claim 1, further comprising:
   responsive to sensing insertion of the peripheral card into the peripheral card slot, attempting to detect whether the auxiliary power connection is employed by the peripheral card;
   responsive to failing to detect whether the auxiliary power connection is employed by the peripheral card, setting a first timeout period before enabling the slot power connection and the auxiliary power connection; and
   enabling only the slot power connection when the first timeout period expires without detecting connection of the auxiliary power connection.

6. The method of claim 1, further comprising:
   sensing a first connection status of the slot power connection and a second connection status of the auxiliary power connection;
   sensing a disconnect of either of the slot power connection and the auxiliary power connection based on the first connection status and the second connection status; and
   concurrently disabling power to both the slot power connection and the auxiliary power connection responsive to sensing the disconnect.

7. The method of claim 5, further comprising:
   detecting connection of the auxiliary power connection at the peripheral card prior to expiration of the first timeout period; and
   responsive to detecting the connection of the auxiliary power connection, concurrently enabling the slot power connection and the auxiliary power connection for the peripheral card.

8. The method of claim 6, further comprising:
   responsive to sensing the disconnect, disabling power to both the slot power connection and the auxiliary power connection until the first connection status and the second connection status indicate both the slot power connection and the auxiliary power connection have been disconnected from the peripheral card.

9. The method of claim 8, further comprising:

responsive to the first connection status and the second connection status indicating both the slot power connection and the auxiliary power connection have been disconnected, setting a second timeout period; and disabling power to both the slot power connection and the auxiliary power connection until the second timeout period expires.

10. An apparatus comprising:

a peripheral card slot to receive a peripheral card;

a power control circuit configured to:

maintain a slot power connection and an auxiliary power connection for the peripheral card slot in a powered-off state during sensing of insertion of the peripheral card into the peripheral card slot and detection of whether the auxiliary power connection is employed by the peripheral card;

based at least on detecting the auxiliary power connection is employed by the peripheral card, apply current limits selected for the peripheral card to the slot power connection and the auxiliary power connection and concurrently enable the slot power connection and the auxiliary power connection for the peripheral card; and based at least on detecting the auxiliary power connection is not employed by the peripheral card, apply a current limit selected for the peripheral card to the slot power connection and enable only the slot power connection for the peripheral card.

11. The apparatus of claim 10, comprising the power control circuit further configured to:

responsive to sensing insertion of the peripheral card into the peripheral card slot, determine power requirement properties of the peripheral card; and adjust the current limits selected for the peripheral card to at least meet the power requirement properties.

12. The apparatus of claim 10, comprising the power control circuit further configured to:

based at least on detecting the auxiliary power connection is employed by the peripheral card, sense connection of the auxiliary power connection to the peripheral card; and enable the slot power connection and the auxiliary power connection only when both the insertion of the peripheral card and connection of the auxiliary power connection are concurrently detected.

13. The apparatus of claim 10, comprising the power control circuit further configured to:

responsive to sensing insertion of the peripheral card into the peripheral card slot, attempt to detect if the auxiliary power connection is employed by the peripheral card;

responsive to failing to detect whether the auxiliary power connection is employed by the peripheral card, set a first timeout period before enabling the slot power connection and the auxiliary power connection; and enable only the slot power connection when the first timeout period expires without detecting a connection of the auxiliary power connection.

14. The apparatus of claim 10, comprising the power control circuit further configured to:

sense a first connection status of the slot power connection and a second connection status of the auxiliary power connection;

sense a disconnect of either of the slot power connection and the auxiliary power connection based on the first connection status and the second connection status; and concurrently disable power to both the slot power connection and the auxiliary power connection responsive to sensing the disconnect.

15. The apparatus of claim 11, comprising the power control circuit further configured to:

responsive to sensing insertion of the peripheral card into the peripheral card slot, enable an auxiliary standby power connection to the peripheral card; and access a data store of the peripheral card using the auxiliary standby power connection to detect:

whether the auxiliary power connection is employed by the peripheral card; and the power requirement properties of the peripheral card.

16. The apparatus of claim 13, comprising the power control circuit further configured to:

detect the connection of the auxiliary power connection at the peripheral card prior to expiration of the first timeout period; and responsive to detecting the connection of the auxiliary power connection, concurrently enable the slot power connection and the auxiliary power connection for the peripheral card.

17. The apparatus of claim 14, comprising the power control circuit further configured to:

responsive to sensing the disconnect, disable power to both the slot power connection and the auxiliary power connection until the first connection status and the second connection status indicate both the slot power connection and the auxiliary power connection have been disconnected from the peripheral card.

18. The apparatus of claim 17, comprising the power control circuit further configured to:

responsive to the first connection status and the second connection status indicating both the slot power connection and the auxiliary power connection have been disconnected, set a second timeout period; and disable power to both the slot power connection and the auxiliary power connection until the second timeout period expires.

* * * * *